US010283566B2

(12) United States Patent
Sel et al.

(10) Patent No.: US 10,283,566 B2
(45) Date of Patent: May 7, 2019

(54) THREE-DIMENSIONAL MEMORY DEVICE WITH THROUGH-STACK CONTACT VIA STRUCTURES AND METHOD OF MAKING THEREOF

(71) Applicant: SANDISK TECHNOLOGIES LLC, Plano, TX (US)

(72) Inventors: Jongsun Sel, Los Gatos, CA (US); Tuan Pham, San Jose, CA (US); Mitsuteru Mushiga, Yokkaichi (JP); Yoshihiro Ikeda, Yokkaichi (JP); Daewung Kang, Milpitas, CA (US); Akio Nishida, Yokkaichi (JP)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 15/610,918

(22) Filed: Jun. 1, 2017

(65) Prior Publication Data
US 2018/0350879 A1    Dec. 6, 2018

(51) Int. Cl.
| | | |
|---|---|---|
| *H01L 27/1157* | (2017.01) | |
| *H01L 27/11582* | (2017.01) | |
| *H01L 27/24* | (2006.01) | |
| *H01L 23/522* | (2006.01) | |

(Continued)

(52) U.S. Cl.
CPC .... *H01L 27/2481* (2013.01); *H01L 21/76879* (2013.01); *H01L 23/5226* (2013.01); *H01L 27/1157* (2013.01); *H01L 27/11582* (2013.01); *H01L 45/16* (2013.01)

(58) Field of Classification Search
None
See application file for complete search history.

(56) References Cited

U.S. PATENT DOCUMENTS

| | | |
|---|---|---|
| 5,915,167 A | 6/1999 | Leedy |
| 8,633,099 B1 | 1/2014 | Shih et al. |
| 8,828,884 B2 | 9/2014 | Lee et al. |

(Continued)

FOREIGN PATENT DOCUMENTS

| | | |
|---|---|---|
| WO | WO 2007004843 A1 | 1/2007 |

OTHER PUBLICATIONS

Endoh et al., "Novel Ultra High Density Memory with a Stacked-Surrounding Gate Transistor (S-SGT) Structured Cell," IEDM Proc., (2001), 33-36.

(Continued)

*Primary Examiner* — Jay C Chang
(74) *Attorney, Agent, or Firm* — The Marbury Law Group, PLLC

(57) ABSTRACT

A three-dimensional memory device includes an alternating stack of insulating layers and electrically conductive layers, an array of memory structures, conductive structures located between a substrate and the alternating stack, conductive via structures, including an upper portion that overlies and contacts a top surface of a respective one of the electrically conductive layers, and a lower portion that underlies and is adjoined to the upper portion, contacts a top surface of a respective one of the conductive structures, and is electrically insulated from the rest of the electrically conductive layers. Inner, outer and intermediate dielectric spacers laterally surround a respective one of the conductive via structures.

13 Claims, 40 Drawing Sheets

(51) Int. Cl.
*H01L 21/768* (2006.01)
*H01L 45/00* (2006.01)

(56) References Cited

U.S. PATENT DOCUMENTS

| | | | |
|---|---|---|---|
| 9,343,507 B2 | 5/2016 | Takaki | |
| 9,397,115 B1 | 7/2016 | Nozawa | |
| 9,412,753 B2 | 8/2016 | Izumi et al. | |
| 9,437,658 B2 | 9/2016 | Sakotsubo | |
| 9,449,924 B2 | 9/2016 | Takaki | |
| 9,502,429 B2 | 11/2016 | Hironaga | |
| 9,515,023 B2 | 12/2016 | Tobitsuka et al. | |
| 9,524,901 B2 | 12/2016 | Izumi et al. | |
| 9,530,787 B2 | 12/2016 | Tsutsumi et al. | |
| 9,583,539 B2 | 2/2017 | Takaki | |
| 9,583,615 B2 | 2/2017 | Chen et al. | |
| 2002/0192908 A1* | 12/2002 | Lin | H01L 21/28273 438/257 |
| 2013/0032922 A1* | 2/2013 | Kawahara | H01L 21/761 257/492 |
| 2013/0043455 A1 | 2/2013 | Bateman | |
| 2014/0239246 A1* | 8/2014 | Noda | H01L 27/2481 257/4 |
| 2015/0036407 A1 | 2/2015 | Nakajima | |
| 2016/0148835 A1 | 5/2016 | Shimabukuro et al. | |
| 2016/0204122 A1 | 7/2016 | Shoji et al. | |
| 2017/0358590 A1* | 12/2017 | Kang | H01L 27/11575 |
| 2017/0364286 A1* | 12/2017 | Shin | G06F 3/0619 |

OTHER PUBLICATIONS

U.S. Appl. No. 15/228,216, filed Aug. 4, 2016, SanDisk Technologies LLC.
U.S. Appl. No. 15/251,374, fiiled Aug. 30, 2016, SanDisk Technologies LLC.
U.S. Appl. No. 15/299,919, filed Oct. 21, 2016, SanDisk Technologies LLC.
U.S. Appl. No. 15/367,791, filed Dec. 2, 2016, SanDisk Technologies LLC.
U.S. Appl. No. 15/400,244, filed Jan. 6, 2017, SanDisk Technologies LLC.
U.S. Appl. No. 15/411,126, filed Jan. 20, 2017, SanDisk Technologies LLC.
U.S. Appl. No. 15/468,519, filed Mar. 24, 2017, SanDisk Technologies LLC.

* cited by examiner

THREE-DIMENSIONAL MEMORY DEVICE WITH THROUGH-STACK CONTACT VIA STRUCTURES AND METHOD OF MAKING THEREOF

FIELD

The present disclosure relates generally to the field of semiconductor devices and specifically to a three-dimensional memory devices employing through-stack contact via structures in a contact region and methods of making the same.

BACKGROUND

Three-dimensional memory devices provide high density memory for modern electronic devices. Examples of three-dimensional memory devices include three-dimensional NAND memory devices and Resistive Random Access Memory (ReRAM) devices.

A ReRAM is a non-volatile memory device employing reversible change in resistance in a thin film with application of electrical voltage bias across the film. Application of the electrical voltage bias in one manner can cause decrease in the resistance of the thin film, for example, by formation of filaments that function as leakage current paths or by increasing a crystallinity of the thin film. Application of a different type of electrical voltage bias can cause reversal of the resistance of the thin film to an original high-resistance state, such as by removal of the filaments from the thin film or by decreasing the crystallinity of the thin film. Thus, data can be stored in a ReRAM cell by changing the resistance of the thin film, which can be a solid-state material. The thin film is referred to as a memory film or a read/write film. Examples of ReRAM devices are described in World Intellectual Property Organization (WIPO) Publication No. WO2007004843 A1 to Hong et al. and U.S. Patent Application Publication No. 2013/0043455 A1 to Bateman.

SUMMARY

According to an aspect of the present disclosure, a three-dimensional memory device comprises an alternating stack of insulating layers and electrically conductive layers located over a substrate; an array of memory structures vertically extending through the alternating stack, wherein each of the memory structures includes memory elements located at levels of the electrically conductive layers; conductive structures located between the substrate and the alternating stack; and conductive via structures. Each conductive via structure comprises an upper portion that overlies and contacts a top surface of a respective one of the electrically conductive layers; and a lower portion that underlies and is adjoined to the upper portion, contacts a top surface of a respective one of the conductive structures, and is electrically insulated from a respective subset of the electrically conductive layers that is located between the respective one of the electrically conductive layers and the conductive structures. The device further comprises inner, outer and intermediate dielectric spacers which laterally surround a respective one of the conductive via structures.

According to another aspect of the present disclosure, a method of forming a three-dimensional memory device comprises forming conductive structures over a substrate; forming an alternating stack of insulating layers and spacer material layers over the conductive structures, wherein the spacer material layers are formed as, or are subsequently replaced with, electrically conductive layers; forming an array of memory structures through the alternating stack, wherein each of the memory structures includes memory elements located at levels of the electrically conductive layers; forming nested dielectric structures, wherein each of the nested dielectric structures comprises a dielectric liner and a dielectric fill structure; forming via cavities through a respective one of the nested dielectric structures and through the alternating stack; etching at least a horizontal portion of the dielectric liners exposed by the dielectric fill structure to expose a portion of a top surface of a respective one of the electrically conductive layers in the via cavities; and forming conductive via structures in the via cavities in contact with the exposed portion of the top surface of a respective one of the electrically conductive layers. The conductive via structures provide an electrically conductive path between a respective pair of the respective one of electrically conductive layers and one of the conductive structures.

BRIEF DESCRIPTION OF THE DRAWINGS

FIG. 4I is a vertical cross-sectional view of the contact region and the peripheral device region of the first exemplary structure after vertical extension of each unmasked upper contact via cavity by two pairs of an electrically conductive layer and an insulating layer along a vertical plane corresponding to the zig-zag vertical plane X-X' of FIG. 3 according to the first embodiment of the present disclosure.

DETAILED DESCRIPTION

Figure 1A:
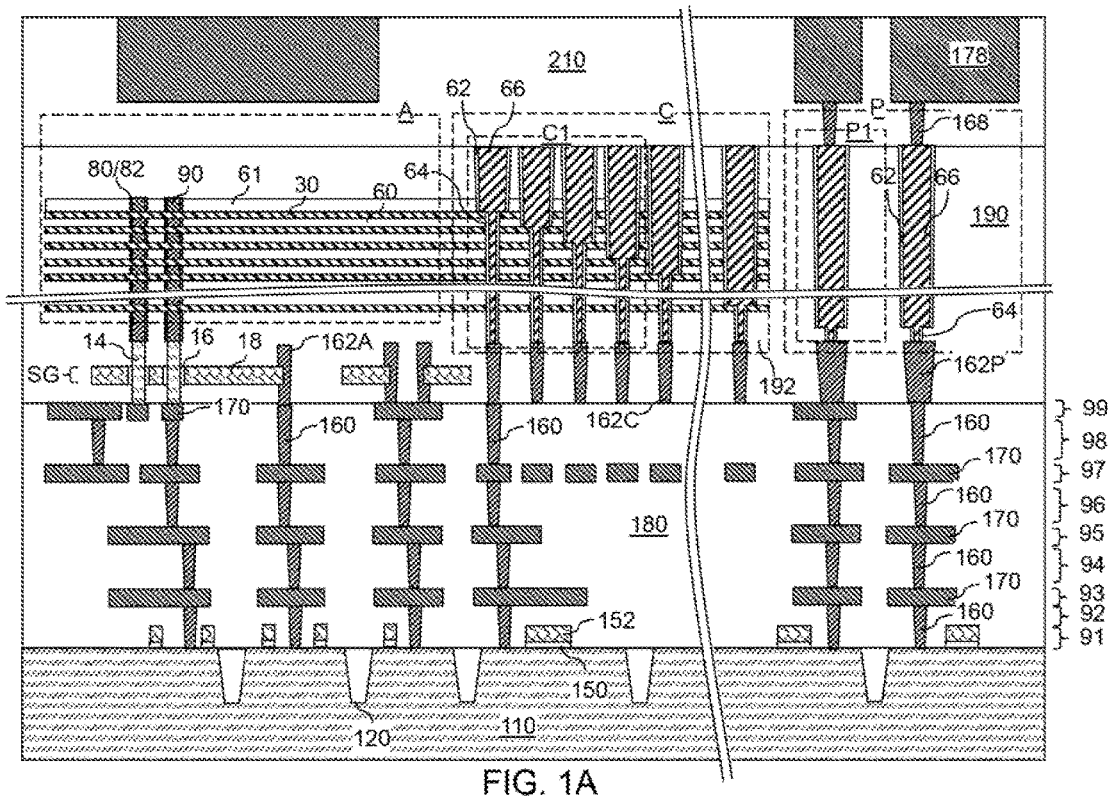
FIG. 1A is a vertical cross-sectional view of a first exemplary structure that includes a three-dimensional memory device according to a first embodiment of the present disclosure.

The various electrically conductive layers embedding the various memory elements of a three-dimensional memory device are typically accessed by various semiconductor devices in a driver circuitry. In many cases, electrical contact to underlying conductive structures (such as metal lines) is provided. While a combination of at least two metal via structures and at least metal line overlying, and contacting, the at least two via structures may be employed to provide such an electrical connection for each of the electrically conductive layers, such an approach can take up a significant area. Thus, a more compact scheme is desired for providing electrical connections between the electrically conductive layers and underlying conductive structures in a three-dimensional memory device.

As discussed above, the present disclosure is directed to a three-dimensional memory devices employing through-stack contact via structures located in a contact region and methods of making the same, the various aspects of which are described below. The embodiments of the disclosure can be employed to form various semiconductor devices such as three-dimensional monolithic memory array devices comprising ReRAM or vertical NAND devices having a more compact through-stack contact via structures.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The same reference numerals refer to the same element or similar element. Unless otherwise indicated, elements having the same reference numerals are presumed to have the same composition. As used herein, a first element located "on" a second element can be located on the exterior side of a surface of the second element or on the interior side of the second element. As used herein, a first element is located "directly on" a second element if there exist a physical contact between a surface of the first element and a surface of the second element.

As used herein, a "layer" refers to a material portion including a region having a thickness. A layer may extend over the entirety of an underlying or overlying structure, or may have an extent less than the extent of an underlying or overlying structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, and/or may have one or more layer thereupon, thereabove, and/or therebelow.

As used herein, a "layer stack" refers to a stack of layers. As used herein, a "line" or a "line structure" refers to a layer that has a predominant direction of extension, i.e., having a direction along which the layer extends the most.

As used herein, a "semiconducting material" refers to a material having electrical conductivity in the range from $1.0 \times 10^{-6}$ S/cm to $1.0 \times 10^5$ S/cm. As used herein, a "semiconductor material" refers to a material having electrical conductivity in the range from $1.0 \times 10^{-6}$ S/cm to $1.0 \times 10^5$ S/cm in the absence of electrical dopants therein, and is capable of producing a doped material having electrical conductivity in a range from 1.0 S/cm to $1.0 \times 10^5$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material, i.e., to have electrical conductivity greater than $1.0 \times 10^5$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^5$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

As used herein, a "field effect transistor" refers to any semiconductor device having a semiconductor channel through which electrical current flows with a current density modulated by an external electrical field. As used herein, an "active region" refers to a source region of a field effect transistor or a drain region of a field effect transistor. A "top active region" refers to an active region of a field effect transistor that is located above another active region of the field effect transistor. A "bottom active region" refers to an active region of a field effect transistor that is located below another active region of the field effect transistor.

A monolithic three dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two-dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three Dimensional Structure Memory." The substrates may be thinned or removed from the memory levels before bonding, but as the memory levels are initially formed over separate substrates, such memories are not true monolithic three dimensional memory arrays.

The various three dimensional memory devices of the present disclosure can include a ReRAM device, and can be fabricated employing the various embodiments described herein. It is understood that a criss-cross array of memory elements that can be accessed by any access scheme can be employed for the resistive memory devices of the present disclosure, and the exemplary structures of the present disclosure are described herein merely provide non-limiting examples of implementation of the memory devices of the present disclosure.

Referring to FIG. 1A, a first exemplary structure including a three-dimensional memory device is illustrated according to a first embodiment of the present disclosure. The first exemplary structure includes a substrate 110, which can include a semiconductor material layer. In one embodiment, the substrate 110 can be a silicon substrate.

Various semiconductor devices can be formed on the substrate 110. For example, shallow trench isolation structures 120 can be formed in an upper portion of the substrate 110 by forming isolation trenches and filling the isolation trenches with a dielectric material such as silicon oxide. Gate stacks (150, 152) can be formed on the top surface of the substrate 110 by deposition and patterning of a gate dielectric layer and a gate electrode layer. Patterned portions of the gate dielectric layer include gate dielectrics 150. Patterned portions of the gate electrode layer include gate electrodes 152. The level of the gate stacks (150, 152) is herein referred to as a gate level 91. Active regions (not explicitly shown) such as source regions, drain regions, source extension regions, and drain extension regions can be formed by implantation of ions into the upper portion of the substrate 110. Gate spacers including a dielectric material can be formed around the gate stacks (150, 152) by deposition of a conformal dielectric material layer and an anisotropic etch.

Lower interconnect level dielectric material layers 180, lower interconnect level via structures 160, and lower interconnect level line structures 170 can be formed over the various semiconductor devices that are formed on the substrate 110. The levels of the lower interconnect level dielectric material layers 180, the lower interconnect level via structures 160, and the lower interconnect level line structures 170 can include a substrate contact level 92, various metal line levels (such as the levels 93, 95, 97, 99), and various metal via levels (such as levels 94, 96, 98).

Memory level dielectric material layers 190 can be subsequently formed over the lower interconnect level dielectric material layers. Access transistors can be formed at a lower level of the memory level dielectric material layers 190. The access transistors can include access transistor gate electrodes 18, access transistor gate dielectrics 16, and semiconductor portion stacks 14. Each semiconductor portion stack 14 can include a vertical channel region that is laterally surrounded by a respective access transistor gate dielectric 16, and a pair of a source region and a drain region located above and below the channel region. The level of the access transistor gate electrodes 18 is herein referred to as a select gate level or an SG level. Various conductive structures (162A, 162C, 162P) can be formed at a bottom region of the memory level dielectric material layers 190, which can include the level of the select gate level. The conductive structures (162A, 162C, 162P) can include memory level array region conductive structures 162A, memory level contact region conductive structures 162C, and memory level peripheral region conductive structures 162P. When referred to with respect to memory devices to be formed above the level of the conductive structures (162A, 162C, 162P), the conductive structures (162A, 162C, 162P) are referred to as a subset of underlying conductive structures, which include the conductive structures (162A, 162C, 162P), the lower interconnect level via structures 160, and the lower interconnect level line structures 170.

An alternating stack of insulating layers 60 and electrically conductive layers 30 is formed over the access transistors, the memory level array region conductive structures 162A, and the memory level contact region conductive structures 162C. In one embodiment, the insulating layers 60 can include a first silicon oxide material. For example, the insulating layers 60 can include undoped silicate glass formed by thermal decomposition or plasma-assisted decomposition of a silicon oxide precursor such as tetraethylorthosilicate (TEOS). In this case the insulating layers 60 can include a TEOS oxide. The electrically conductive layers 30 can include metallic layers such as TiN layers or W layers, or conductive semiconductor material layers including a heavily doped semiconductor material (i.e., a semiconductor material with a high concentration of electrical dopants to be conductive). The thickness of each of the insulating layers 60 and the electrically conductive layers 30 can be in a range from 20 nm to 100 nm, although lesser and greater thicknesses can also be employed. In one embodiment, each insulating layer 60 may have a first thickness, and each electrically conductive layer 30 may have a second thickness.

An optional insulating cap layer 61 can be formed over the alternating stack (30, 60). Vertically extending openings can be formed through the optional insulating cap layer 61 and the alternating stack (30, 60) such that a top surface of an underlying semiconductor portion stack 14 is physically exposed at the bottom of each vertically extending opening. A stack of a resistive memory material layer 80 and an optional steering element layer 82 can be formed at the periphery of each vertically extending opening. Subsequently, a vertical bit line 90 can be formed within each remaining volume of the vertically extending cavities and on top surfaces of the semiconductor portion stacks 14.

The alternating stack (30, 60) can be patterned to form a contact region C. A contact region is formed by patterning the alternating stack (30, 60). The region in which all layers of the alternating stack (30, 60) are present includes an array region A. Contact via structures are subsequently formed in the contact region C. The region in which the alternating stack (30, 60) is not present can be employed to provide electrical wiring for peripheral circuitry of the three-dimensional memory device, and as such, is herein referred to as a peripheral region P.

Two-stage contact via cavities are formed in the contact region C and optionally in the peripheral region P. As used herein, a "two-stage" structure refers to a structure having an upper stage having a first width and a lower stage having a second width that is different from the first width. Specifically, each two-stage contact via cavity includes an upper cavity having a respective upper width and a lower cavity having a respective lower width with a top surface of one electrically conductive layer exposed at the bottom of the upper stage.

The two-stage contact via cavities include first type two-stage contact via cavities having a respective upper cavity vertically extending down to a top surface of a respective one of the electrically conductive layers 30 and a respective lower cavity vertically extending from the bottom portion of the upper cavity through each layer of the alternating stack (30, 40) that underlies the upper cavity. Each lower cavity can extend down to a respective one of the memory level contact region conductive structures 162C.

Optionally, the two-stage contact via cavities can include second type two-stage contact via cavities that are formed in the peripheral region P. Each second type two-stage contact via cavity can include a respective upper cavity vertically extending through the entire levels of the alternating stack (30, 60) and a respective lower cavity vertically extending from the bottom portion of the upper cavity to a respective one of the memory level peripheral region conductive structures 162P.

A conformal insulating material layer is formed in the two-stage contact via cavities by a conformal deposition process. Horizontal portions of the conformal insulating material layer can be removed by an anisotropic etch. An upper dielectric spacer 62 is formed within each upper cavity of the two-stage contact via cavities, and a lower dielectric spacer 64 is formed within each lower cavity of the two-stage contact via cavities. At least one conductive material is deposited in unfilled volumes of the two-stage contact via cavities to form two-stage contact via structures 66.

The two-stage contact via structures 66 can include first type two-stage contact via structures that are formed in the contact region C. Each first type two-stage contact via structure includes an upper portion that extends above the electrically conductive layer 30 and having an upper width and a lower portion that extends through, and below, the electrically conductive layer 30 and having a lower width that is less than the upper width. A bottom horizontal surface of the upper portion contacts a top surface of one of the electrically conductive layers 30.

Upper interconnect level dielectric material layers 210 are formed over the memory level dielectric material layers 190 and the two-stage contact via structures 66. Upper interconnect level via structures 168 and upper interconnect level line structures 178 can be formed within the upper interconnect level dielectric material layers 210.

Figure 1B:
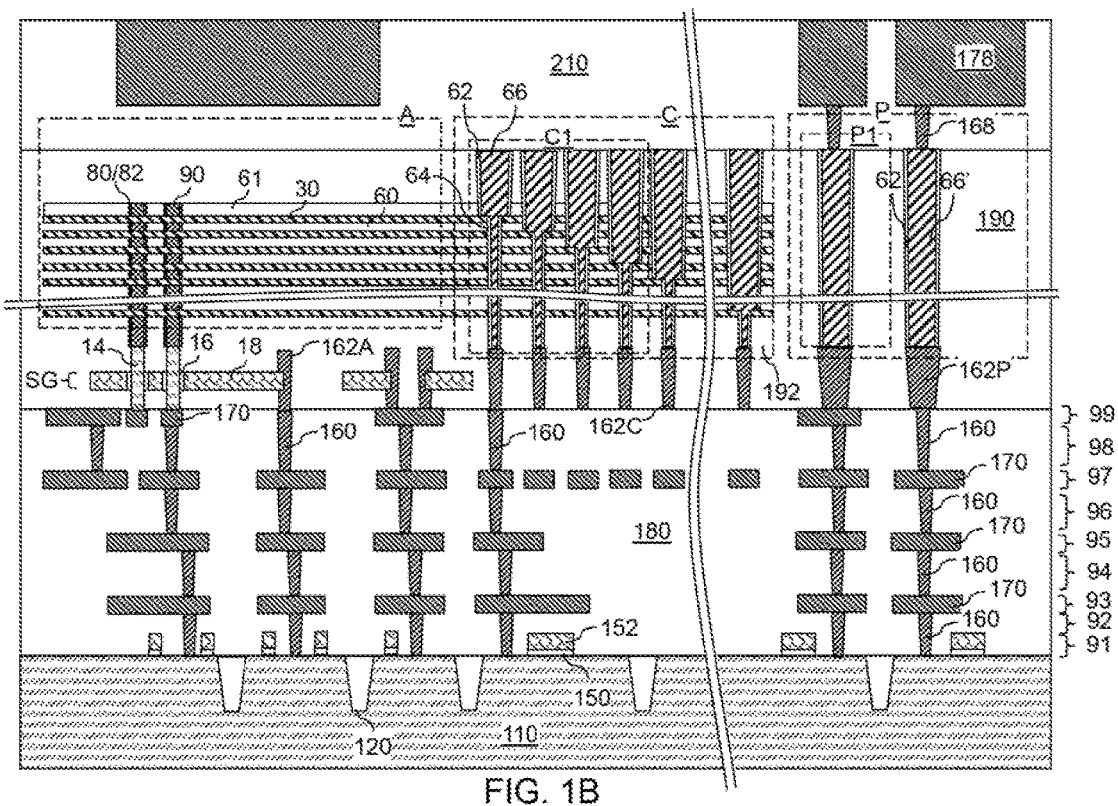
FIG. 1B is a vertical cross-sectional view of an alternative embodiment of the first exemplary structure according to the first embodiment of the present disclosure.

FIG. 1B illustrates an alternative embodiment of the first exemplary structure, in which the second type two-stage contact via structures are replaced with one-stage contact via structures 66' in region P that extend between a topmost surface and a bottommost surface without any horizontal step. The one-stage contact via structures 66' can be derived from the second type two-stage contact via structures 66 of FIG. 1A as the height of the lower portion of each second type two-stage contact via structure shrinks to zero.

FIGS. 2, 3, 4A-4J, 5A, 5B, and 6-15B illustrate a sequence of processing steps for forming the two-stage contact via structures 66 described in FIG. 1A.

Figure 2:
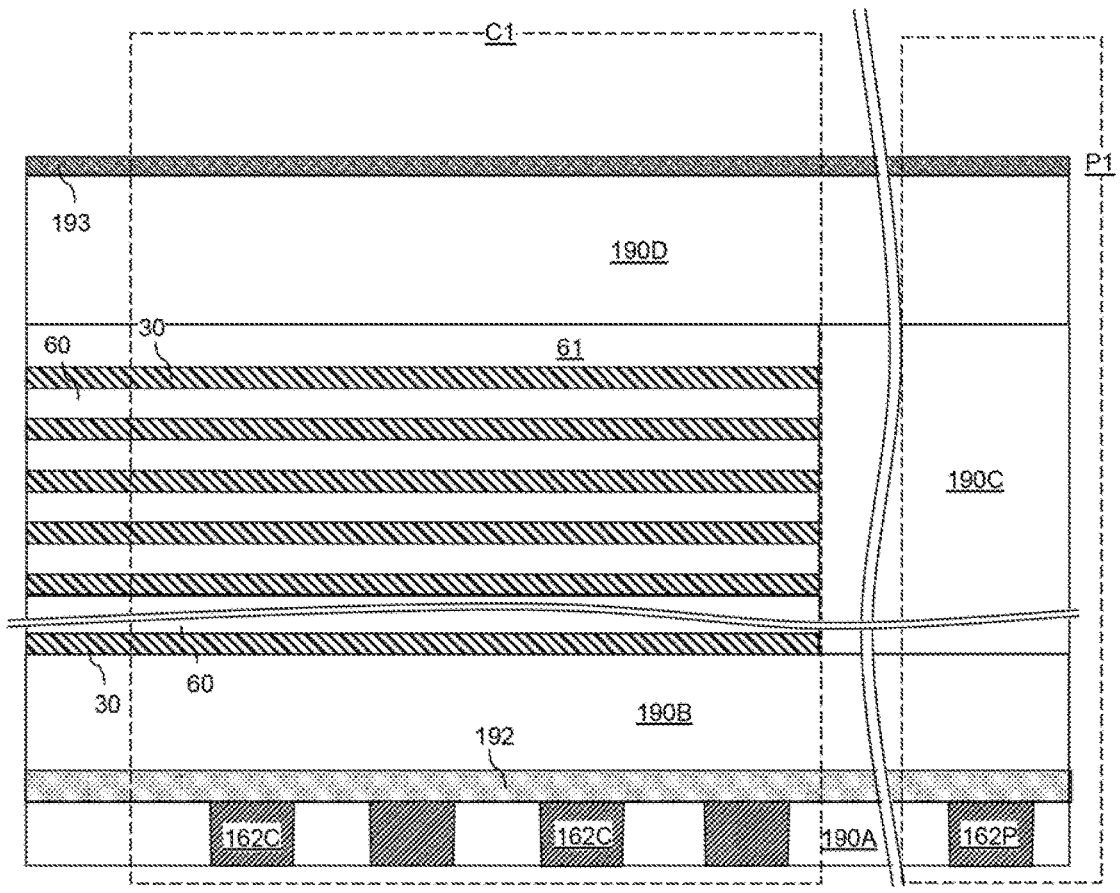
FIG. 2 is a contact region and a peripheral device region of the first exemplary structure after formation of an alternating stack of insulating layers and electrically conductive layers, an insulating cap layer, a third memory level dielectric material layer, and a dielectric hard mask layer according to the first embodiment of the present disclosure.

Referring to FIG. 2, a portion of the first exemplary structure is shown at a processing step during fabrication. Processing steps up to formation of the memory level dielectric material layers 190 can be performed. The memory level dielectric material layers 190 can include a first memory level dielectric material layer 190A embedding the memory level contact region conductive structures 162C and memory level peripheral region conductive structures 162P. The memory level contact region conductive structures 162C can be located within an illustrated contact region C1, which is an illustrated portion of the contact region C in FIG. 1A. The memory level peripheral region conductive structures 162P can be located within an illustrated peripheral region P1, which is an illustrated portion of the peripheral region P in FIG. 1A. The memory level array region conductive structures 162A (shown in FIGS. 1A and 1B) can be located within the array region A. The memory level contact region conductive structures 162C can include metal interconnect lines that provide control signals to the electrically conductive layers 30 within the alternating stack of insulating layers 60 and the electrically conductive layers 30.

The memory level dielectric material layers 190 can include an optional etch stop dielectric layer 192 that is formed on the top surface of the memory level conductive structures (162C, 162P). The optional etch stop dielectric layer 192 includes a dielectric material having a greater etch resistivity than another dielectric material that is deposited over the etch stop dielectric layer 192 to form a second memory level dielectric material layer 190B. For example, the first and second memory level dielectric material layers (190A, 190B) can include silicon oxide, and the etch stop dielectric layer 192 can include silicon nitride or a dielectric metal oxide (such as aluminum oxide). Various semiconductor devices such as access transistors can be formed at the level of the first and second memory level dielectric material layers (190A, 190B) and the optional etch stop dielectric layer 192 within the array region A. Exemplary semiconductor devices that can be formed in the array region A are described in a subsequent section.

An alternating stack of insulating layers 60 and spacer material layers are formed over the second memory level dielectric material layer 190B. The spacer material layers can be formed as electrically conductive layers 30, or can be formed as sacrificial material layers and can be subsequently replaced with electrically conductive layers 30. While the present disclosure is described employing an embodiment in which the spacer material layers are formed as electrically conductive layers 30, embodiments are expressly contemplated herein in which the spacer material layers are formed as sacrificial material layers, and are subsequently replaced with electrically conducive layers 30 after formation of memory elements within the array region A. In case the spacer material layers are formed as electrically conductive layers 30, an alternating stack of insulating layers 60 and electrically conductive layers 30 can be formed on the second memory level dielectric material layer 190B. An insulating cap layer 61 can be formed over the alternating stack (30, 60).

An array of memory structures can be formed through the alternating stack (30, 60). Each of the memory structures includes memory elements (e.g., portions of resistive memory material layer or a charge trapping layer) located at levels of the electrically conductive layers 30. Three-dimensional memory elements can be formed in the array region A, which may include resistive random access memory (ReRAM) cells. Exemplary ReRAM devices that can be formed in the array region A are described in a subsequent section.

Portions of the insulating cap layer 61 and the alternating stack (30, 60) can be removed from the peripheral region P, for example, by a combination of lithographic patterning and an anisotropic etch. A memory level dielectric material portion 190C can then be formed in the peripheral region in place of the removed portions of the insulating cap layer 61 and the alternating stack (30, 60).

An third memory level dielectric material layer 190D can be formed over the alternating stack (30, 60) and the memory level dielectric material portion 190C as another component of the memory level dielectric material layers 190. The third memory level dielectric material layer 190D can include, for example, silicon oxide. The thickness of the third memory level dielectric material layer 190D, if present, can be in a range from 50 nm to 1,000 nm, although lesser and greater thicknesses can also be employed.

A dielectric hard mask layer 193 can be formed over the third memory level dielectric material layer 190D and/or the alternating stack (30, 60) and the memory level dielectric material portion 190C as another component of the memory level dielectric material layers 190. The dielectric hard mask layer 193 can be employed as an etch stop layer during subsequent anisotropic etch processes, and may also be employed as a stopping layer in a subsequent planarization process such as chemical mechanical planarization (CMP). The dielectric hard mask layer 193 can include, if present, silicon nitride and/or a dielectric metal oxide (such as aluminum oxide).

Figure 3:
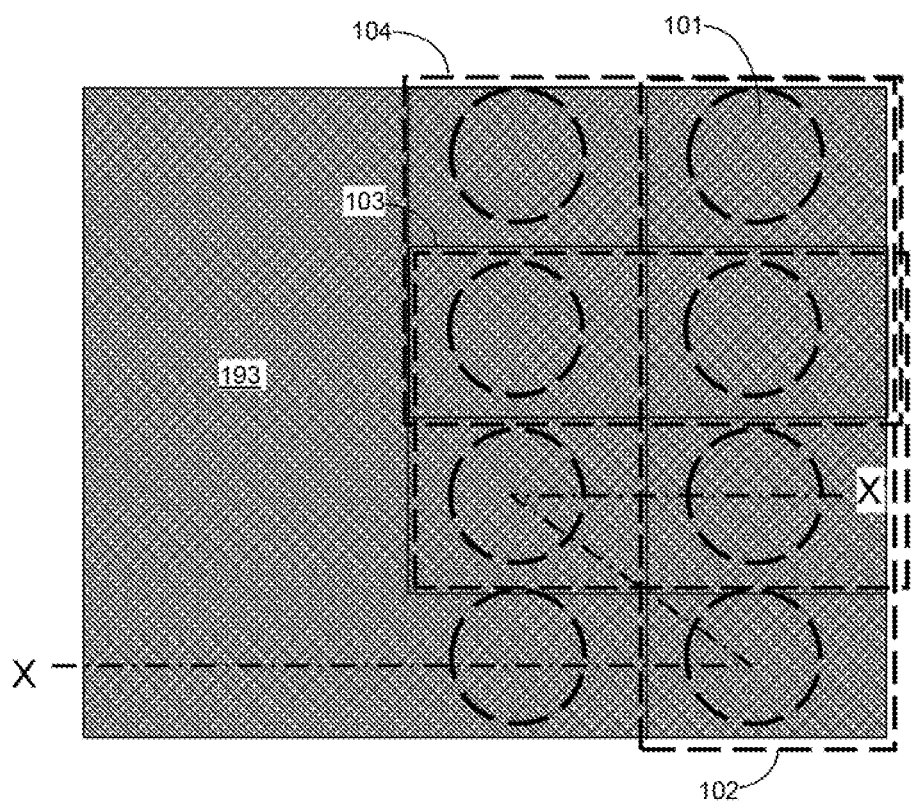
FIG. 3 is a top-down view of the contact region of the first exemplary structure of FIG. 2. Openings in various lithographic masks are illustrated in dotted lines. The zig-zag vertical plane X-X' is the plane of the vertical cross-sectional view of FIG. 2.

Upper contact via cavities can be formed by employing a set of patterned etch masks (such as patterned photoresist layers) that provide different opening areas. FIG. 3 illustrates an example in which 4 different patterned etch masks that provide 4 different opening areas, which include upper contact via cavity areas 101, a first opening area 102, a second opening area 103, and a third opening area 104. A first photoresist layer including the pattern of the upper contact via cavity areas 101 can be employed to define the areas all upper contact via cavities irrespective of their final depth. Via-blocking photoresist layers can be subsequently employed to block, i.e., cover, a respective subset of upper contact via cavities to prevent further etching of the respective subset of upper contact via cavities in a respective subsequent etch process.

By designing the shapes of the opening areas (102, 103, 104) for the via-blocking photoresist layers to have intersecting areas, 8 different depths can be provided for the upper contact via cavities in case three different opening areas (102, 103, 104) are employed. For each integer i among 1, 2, and 3, $2^{i-1}$ levels of electrically conductive layers 30 can be etched within the i-th opening area. For example, a single insulating layer 60 and a single electrically conductive layer 30 can be etched within the first opening area 102, two insulating layers 60 and two electrically conductive layers 30 can be etched within the second opening area 103, and four insulating layers 60 and four electrically conductive layers 30 can be etched within the third opening area 104. The combination of three patterned etch masks having overlapping areas can thus generate $2^3=8$ horizontal surfaces of the electrically conductive layers 30 that are not covered by any overlying electrically conductive layer 30.

Generally speaking, N masks having overlapping opening areas can generate $2^N$ different overlapping areas to provide $2^N$ electrically conductive layers 30 having a respective horizontal surface that is not covered by any overlying electrically conductive layer 30, thereby providing a contact region in which horizontal top surfaces of each of the $2^N$ electrically conductive layers 30 are physically exposed in a top-down plan view. The number N can be in a range from 2 to 10, although a greater number can also be employed. In the contact region, each electrically conductive layer 30 that is not a bottommost electrically conductive layer 30 has a lesser area than any underlying electrically conductive layer 30 among the electrically conductive layers 30.

Figure 4A:
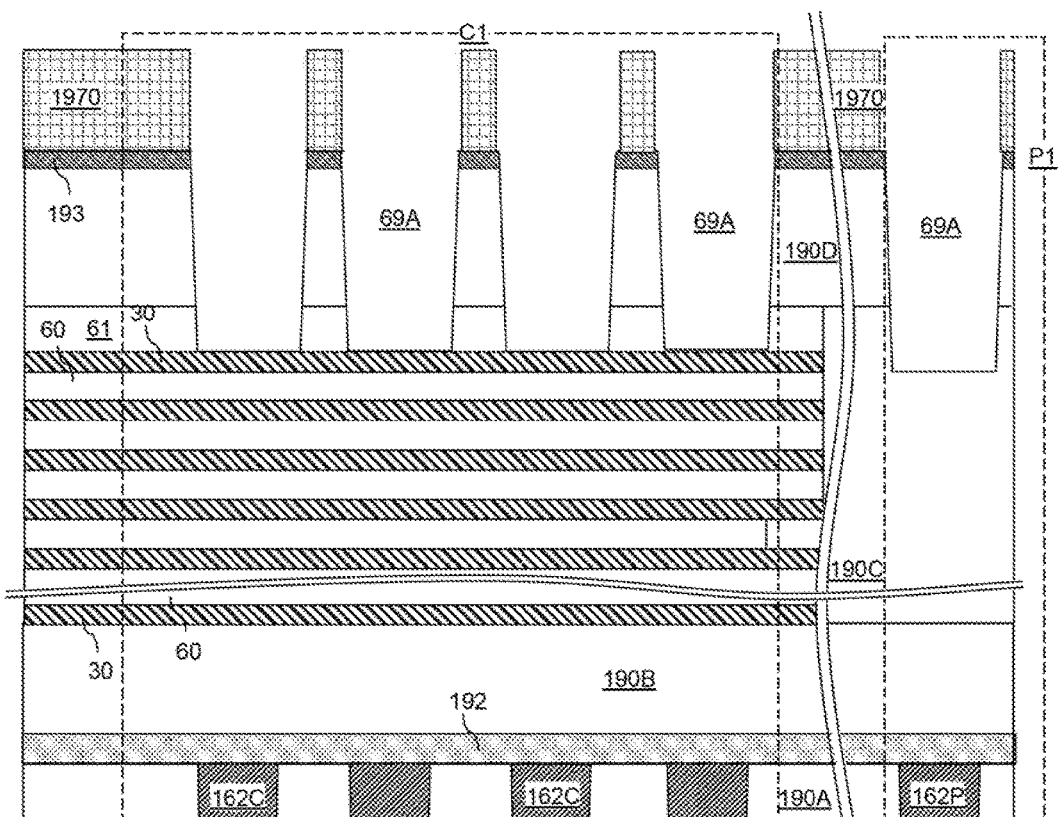
FIG. 4A is a vertical cross-sectional view of the contact region and the peripheral device region of the first exemplary structure after formation of upper contact via cavities through the levels of the dielectric hard mask layer, the third memory level dielectric material layer, and the insulating cap layer along a vertical plane corresponding to the zig-zag vertical plane X-X' of FIG. 3 according to the first embodiment of the present disclosure.
Figure 4B:
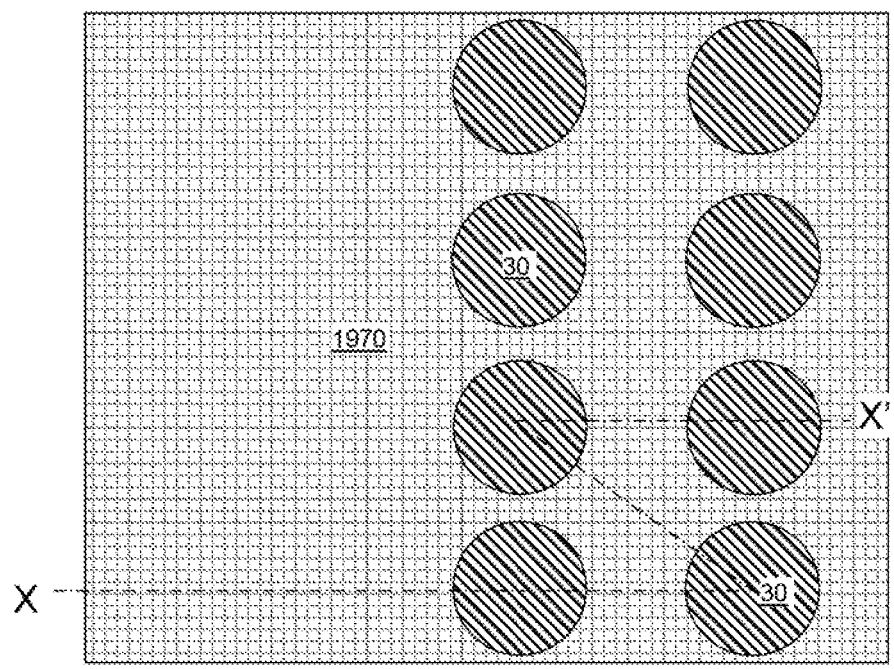
FIG. 4B is a top-down view of the structure of FIG. 4A.

Referring to FIGS. 4A and 4B, a photoresist layer, which is herein referred to as a via-cavity-defining photoresist layer 1970, is applied over the dielectric hard mask layer 193, and is lithographically patterned to form openings in the upper contact via cavity areas 101 shown in FIG. 3. The upper contact via cavity areas 101 include each area in which upper contact via cavities 69A are to be subsequently formed, and includes areas within the contact region C (which includes the illustrated contact region C1) and can also include area(s) within the peripheral region P (which includes the illustrated peripheral region P1).

An anisotropic etch is performed to transfer the pattern of the openings in the via-cavity-defining photoresist layer 1970 through the levels of the dielectric hard mask layer 193, the third memory level dielectric material layer 190D, and the insulating cap layer 61. The chemistry of the anisotropic etch is selected such that the anisotropic etch process is selective to the material of the electrically conductive layers 30 (or sacrificial material layers in case the spacer material layers are provided as the sacrificial material layers and replacement of the sacrificial material layers with electrically conducive layers 30 has not been performed yet). In other words, the insulating layers 60 are preferentially etched compared to the electrically conductive layers 30.

Upper contact via cavities 69A are formed underneath each opening in the via-cavity-defining photoresist layer 1970. Top surfaces of the topmost electrically conductive layers 30 are physically exposed at a bottom of each of the upper contact via cavities 69A within the contact region C that includes the illustrated contact region C1. In other words, each bottom surface of the upper contact via cavities 69A in the contact region C can be a physically exposed top surface of the topmost electrically conductive layer 30. Within the peripheral region P that includes the illustrated peripheral region P1, each bottom surface of the upper contact via cavities 69A can be a horizontal surface of the memory level dielectric material portion 190C. The via-cavity-defining photoresist layer 1970 is subsequently removed, for example, by ashing.

Figure 4C:
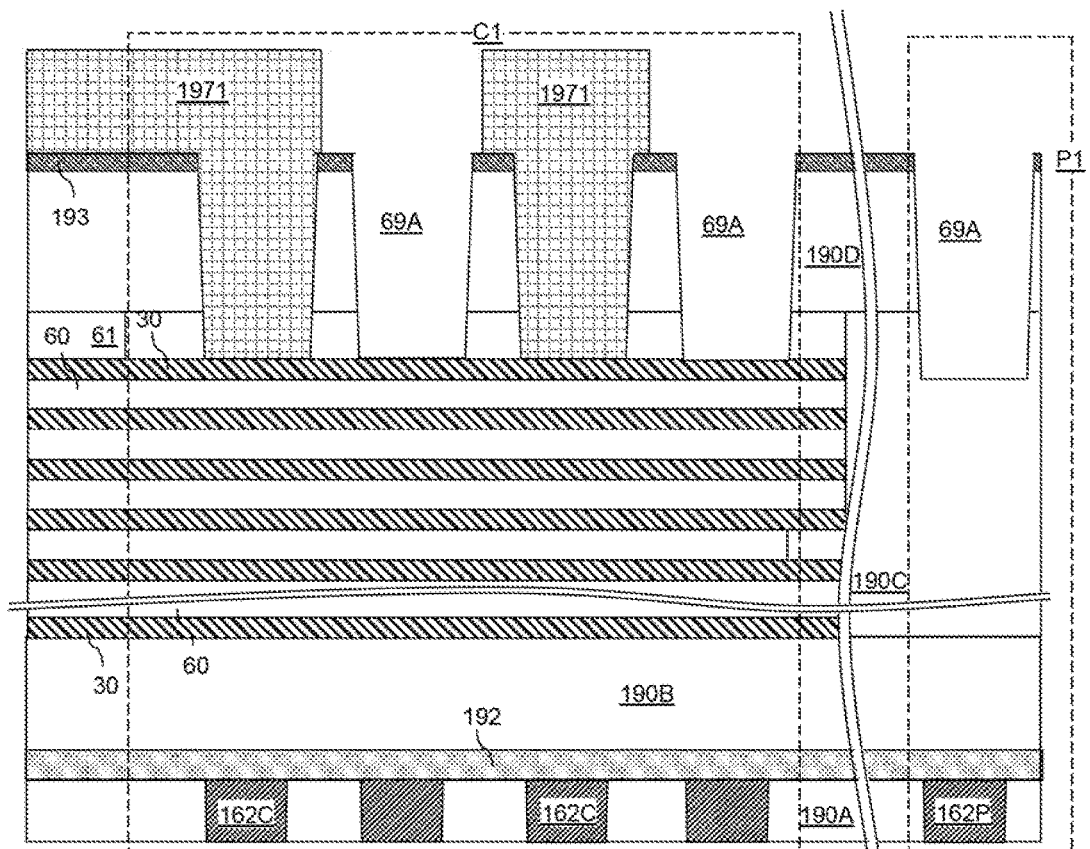
FIG. 4C is a vertical cross-sectional view of the contact region and the peripheral device region of the first exemplary structure after application and patterning of a first via-blocking photoresist layer along a vertical plane corresponding to the zig-zag vertical plane X-X' of FIG. 3 according to the first embodiment of the present disclosure.
Figure 4D:
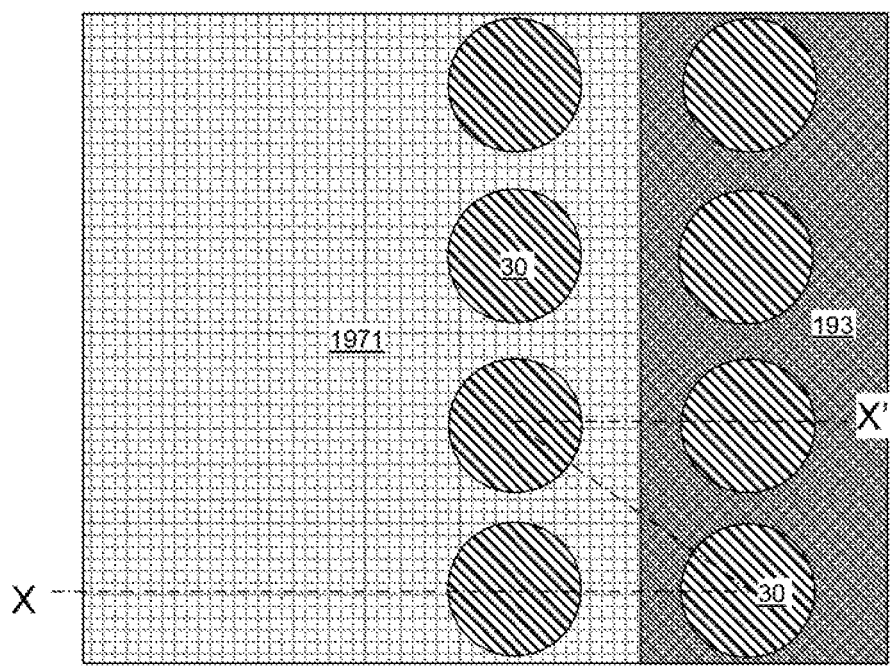
FIG. 4D is a top-down view of the structure of FIG. 4C.

Referring to FIGS. 4C and 4D, a photoresist layer, which is herein referred to as a first via-blocking photoresist layer 1971, is applied over the dielectric hard mask layer 193, and is lithographically patterned to form openings in the first opening area 102 shown in FIG. 3. The first opening area 102 includes each area in which upper contact via cavities 69A, upon completion of formation, are to vertically extend to even numbered electrically conductive layers 30 as counted from the top. In other words, when the topmost electrically conductive layer 30 is labeled as a first electrically conductive layer, the second electrically conductive layer 30 from the top is labeled as a second electrically conductive layer, and each electrically conductive layer 30 that occupies the i-th position as counted from the top is labeled as an i-th electrically conductive layer, the first opening area 102 includes each area in which upper contact via cavities 69A, upon completion of formation, are to vertically extend to even numbered electrically conductive layers 30. The first opening area 102 includes an area inside the contact region C (which includes the illustrated contact region C1) and optionally another area within the peripheral region P (which includes the illustrated peripheral region P1).

Figure 4E:
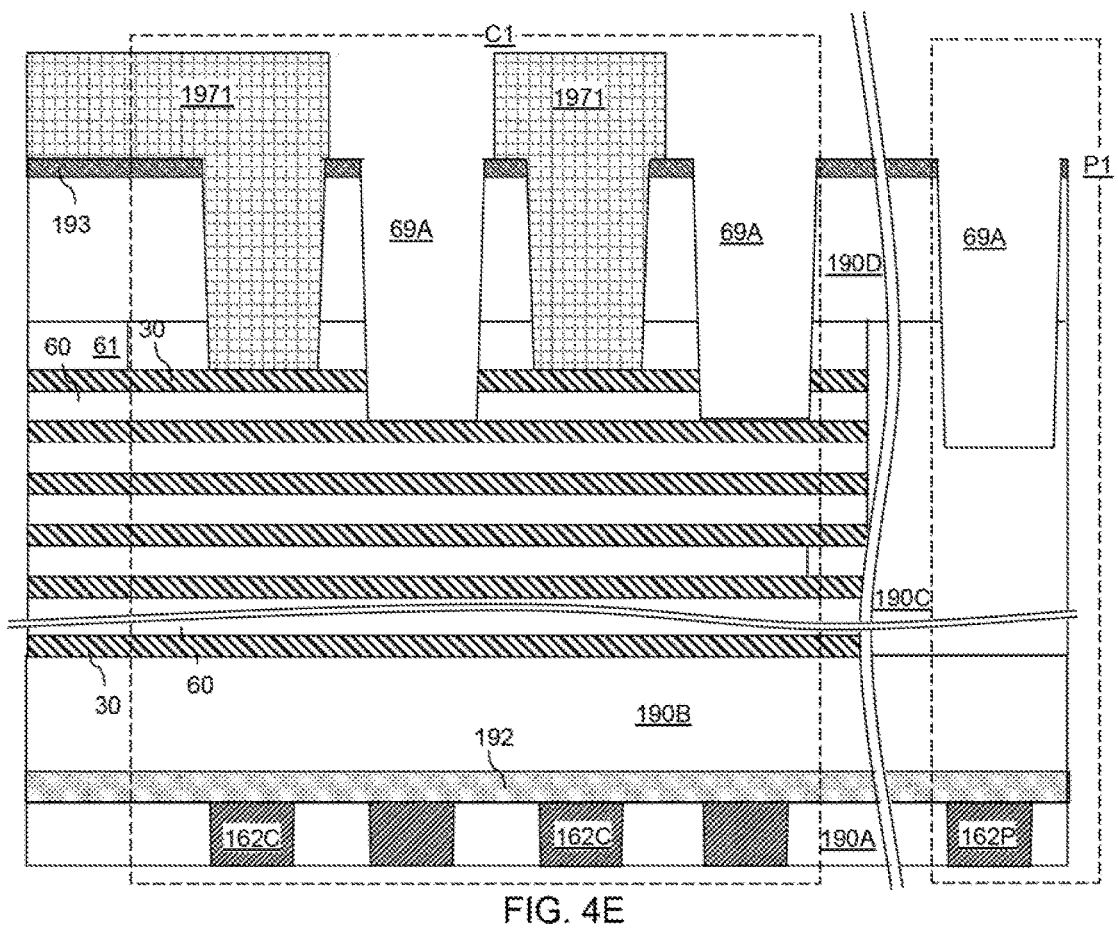
FIG. 4E is a vertical cross-sectional view of the contact region and the peripheral device region of the first exemplary structure after vertical extension of each unmasked upper contact via cavity by one pair of an electrically conductive layer and an insulating layer along a vertical plane corresponding to the zig-zag vertical plane X-X' of FIG. 3 according to the first embodiment of the present disclosure.
Figure 4F:
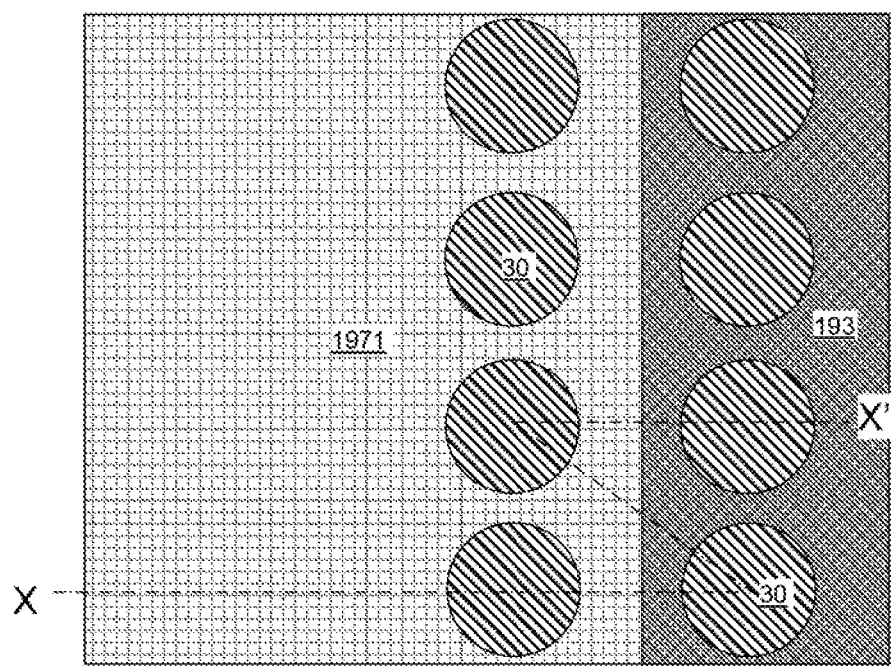
FIG. 4F is a top-down view of the structure of FIG. 4E.

Referring to FIGS. 4E and 4F, an anisotropic etch is performed to transfer the pattern of the openings in the first via-blocking photoresist layer 1971 through the levels of one pair of an electrically conductive layer 30 and an insulating layer 60. In this case, the pattern of the openings in the first via-blocking photoresist layer 1971 can be transferred through the topmost electrically conductive layer 30 and the topmost insulating layer 60. The chemistry of the anisotropic etch is selected such that the anisotropic etch process is selective to the material of the electrically conductive layers 30 at the end of the last step that etches the topmost insulating layer 60.

The upper contact via cavities 69A are vertically extended only within the unmasked area, i.e., only within the first opening area 102 within the first via-blocking photoresist layer 1971. After the anisotropic etch, top surfaces of a lower level (e.g., second from the top level) electrically conductive layer 30 are physically exposed at a bottom of each vertically extended upper contact via cavity 69A within the contact region C that includes the illustrated contact region C1. Within the peripheral region P that includes the illustrated peripheral region P1, each bottom surface of the vertically extended upper contact via cavities 69A can be a horizontal surface of the memory level dielectric material portion 190C. In one embodiment, each upper contact via cavity 69A can be vertically extended in the peripheral region P. The first via-blocking photoresist layer 1971 is subsequently removed, for example, by ashing.

Figure 4G:
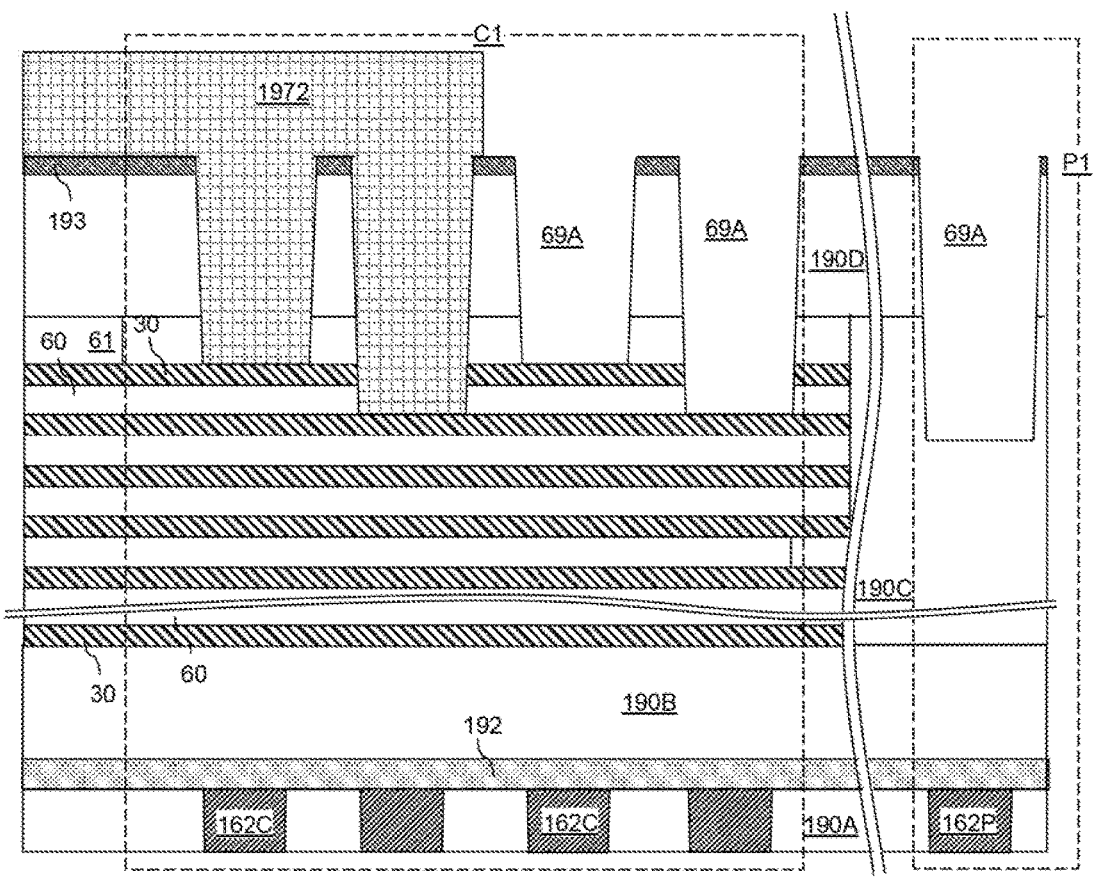
FIG. 4G is a vertical cross-sectional view of the contact region and the peripheral device region of the first exemplary structure after application and patterning of a second via-blocking photoresist layer along a vertical plane corresponding to the zig-zag vertical plane X-X' of FIG. 3 according to the first embodiment of the present disclosure.
Figure 4H:
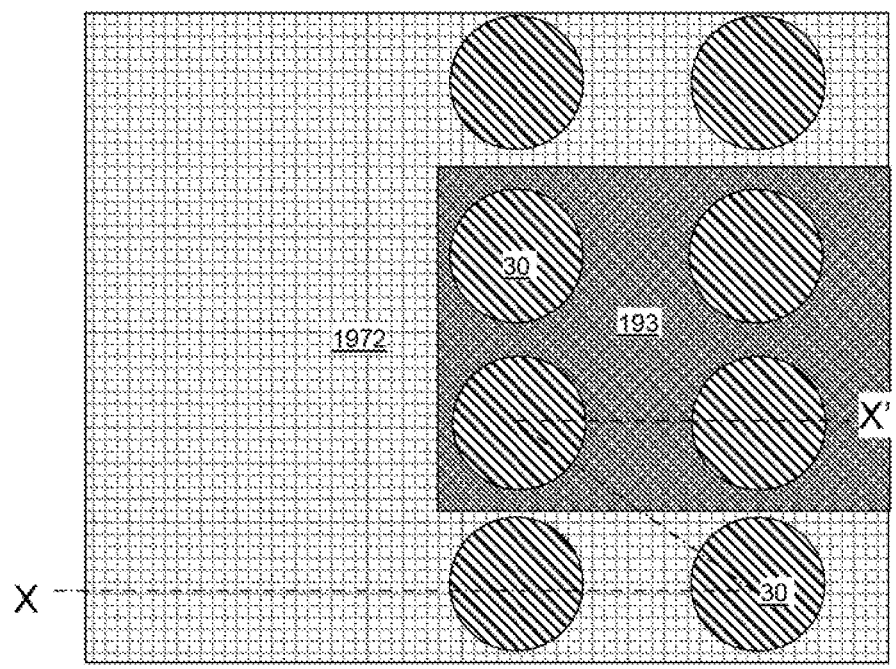
FIG. 4H is a top-down view of the structure of FIG. 4G.
Figure 41:
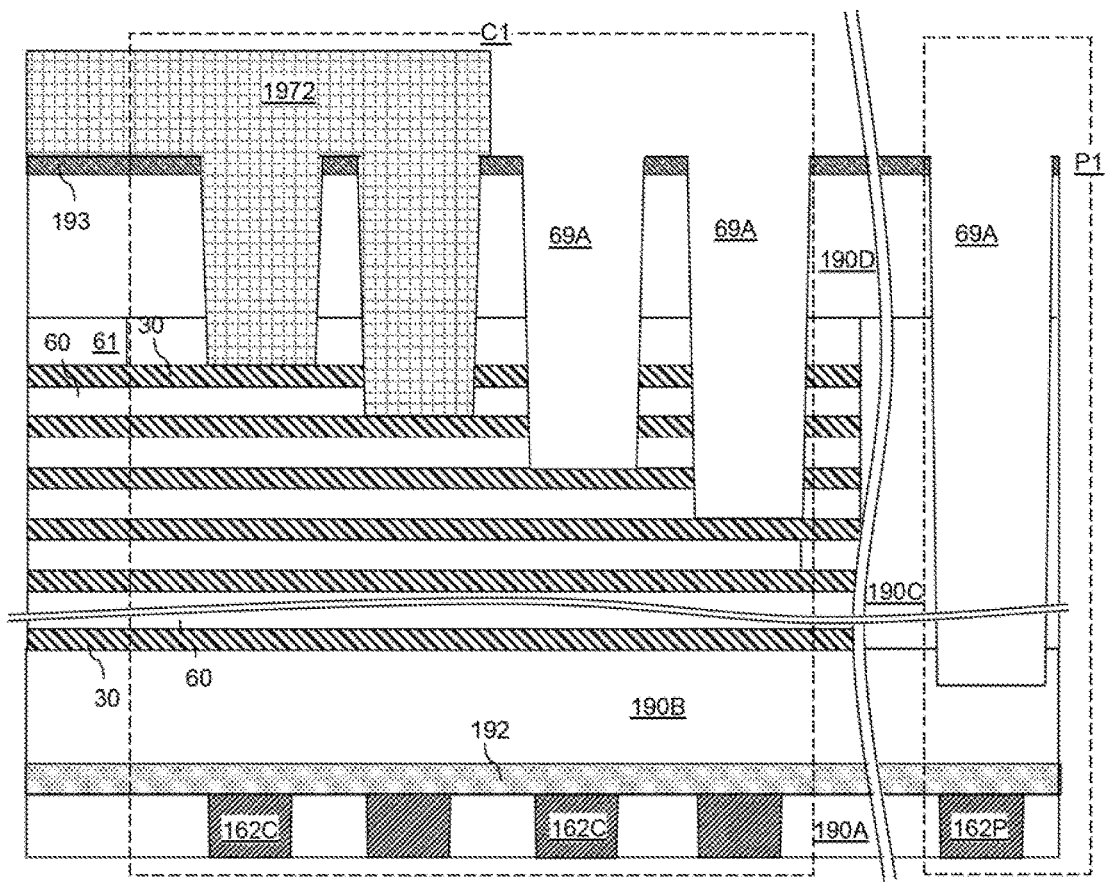

Referring to FIGS. 4G and 4H, a photoresist layer, which is herein referred to as a second via-blocking photoresist layer 1972, is applied over the dielectric hard mask layer 193, and is lithographically patterned to form openings in the second opening area 103 shown in FIG. 3. The second opening area 103 includes each area in which upper contact via cavities 69A, upon completion of formation, are to vertically extend to third and fourth electrically conductive layers 30. The second opening area 103 includes an area inside the contact region C (which includes the illustrated contact region C1) and another area within the peripheral region P (which includes the illustrated peripheral region P1).

Figure 4J:
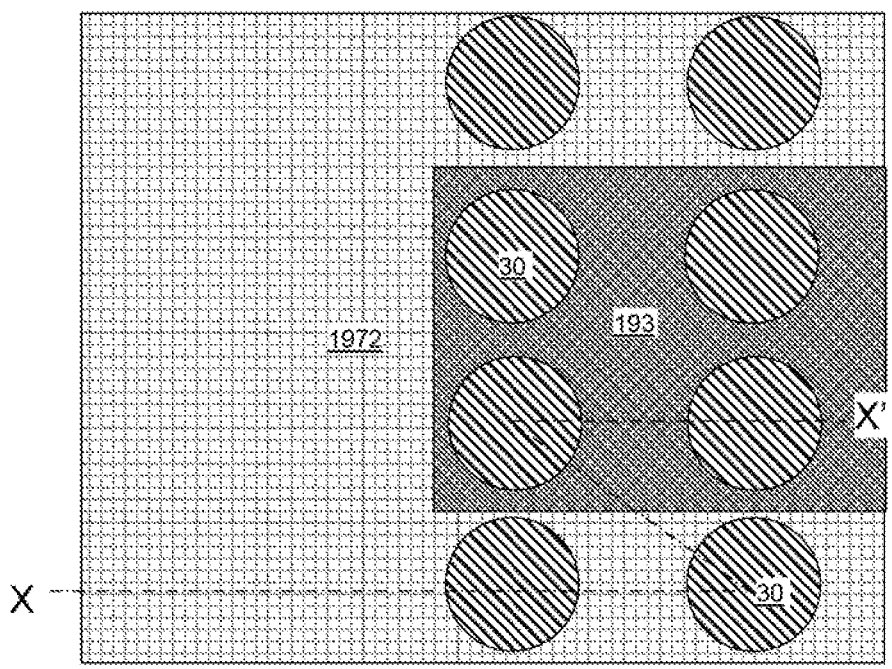
FIG. 4J is a top-down view of the structure of FIG. 4I.

Referring to FIGS. 4I and 4J, an anisotropic etch is performed to transfer the pattern of the openings in the second via-blocking photoresist layer 1972 through the levels of two pairs of an electrically conductive layer 30 and an insulating layer 60. The chemistry of the anisotropic etch is selected such that the anisotropic etch process is selective to the material of the electrically conductive layers 30 at the end of the last step that etches an insulating layer 60.

The upper contact via cavities 69A are vertically extended only within the unmasked area, i.e., only within the second opening area 103 within the second via-blocking photoresist layer 1972. After the anisotropic etch, top surfaces of lower level (e.g., third and fourth from the top levels) electrically conductive layers 30 are physically exposed at a bottom of each vertically extended upper contact via cavity 69A within the contact region C that includes the illustrated contact region C1. Within the peripheral region P that includes the illustrated peripheral region P1, each bottom surface of the vertically extended upper contact via cavities 69A can be a horizontal surface of the memory level dielectric material portion 190C. In one embodiment, each upper contact via cavity 69A can be vertically extended in the peripheral region P. The second via-blocking photoresist layer 1972 is subsequently removed, for example, by ashing.

Application and patterning of i-th via-blocking photoresist layer to form openings in the i-th opening area, and an anisotropic etch that removes $2^{(i-1)}$ pairs of an electrically conductive layer 30 and an insulating layer 60 can be performed for each integer i that is greater than 2 up to the maximum number of the via blocking mask levels. Generally, N number of via blocking masks can provide upper contact via cavities 69A extending to top surfaces of $2^N$ different electrically conductive layers 30. The depth of the upper contact via cavities 69A in the peripheral regions P can be adjusted to any target depth by covering one or more of the upper contact via cavities 69A in the peripheral regions P with one or more of the via-blocking photoresist layers during any one or more of the vertical extensions of the upper contact via cavities 69A in the contact region C. Each via-blocking photoresist layer can be subsequently removed, for example, by ashing.

Figure 5A:
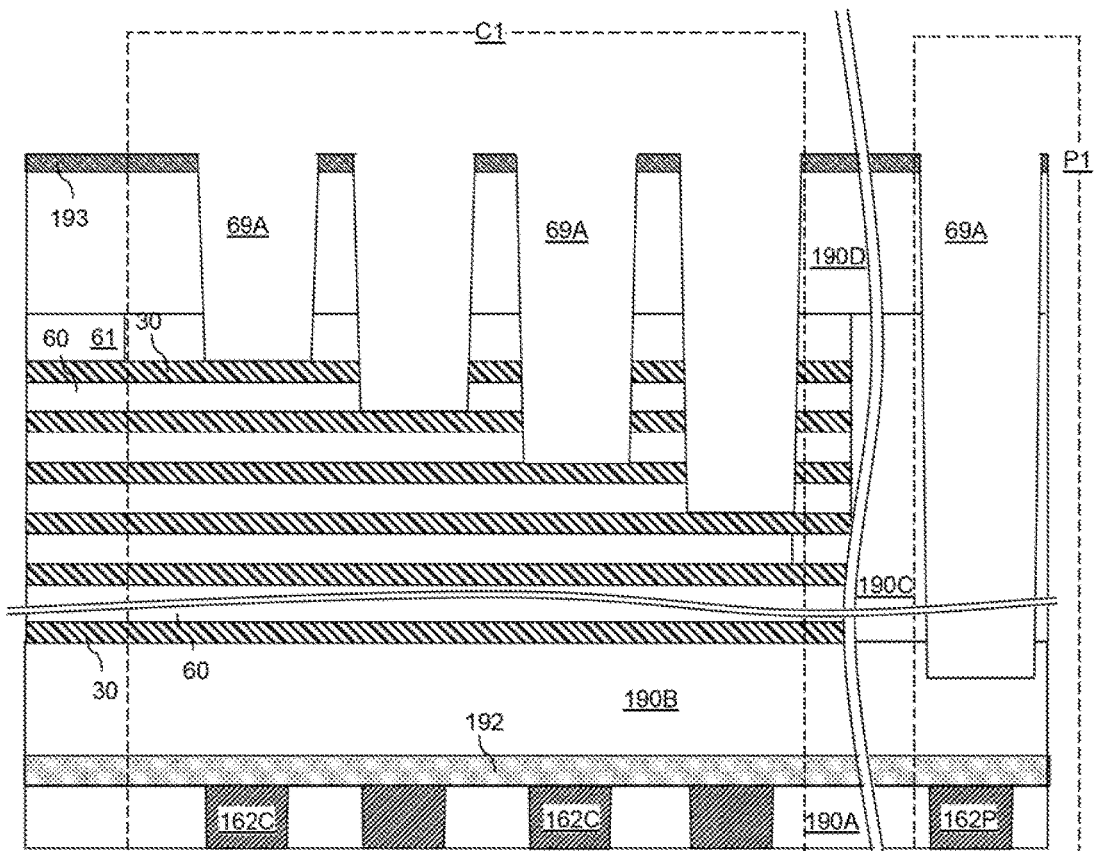
FIG. 5A is a vertical cross-sectional view of the contact region and the peripheral device region of the first exemplary structure after completion of vertical extension of the contact via cavities according to the first embodiment of the present disclosure.
Figure 5B:
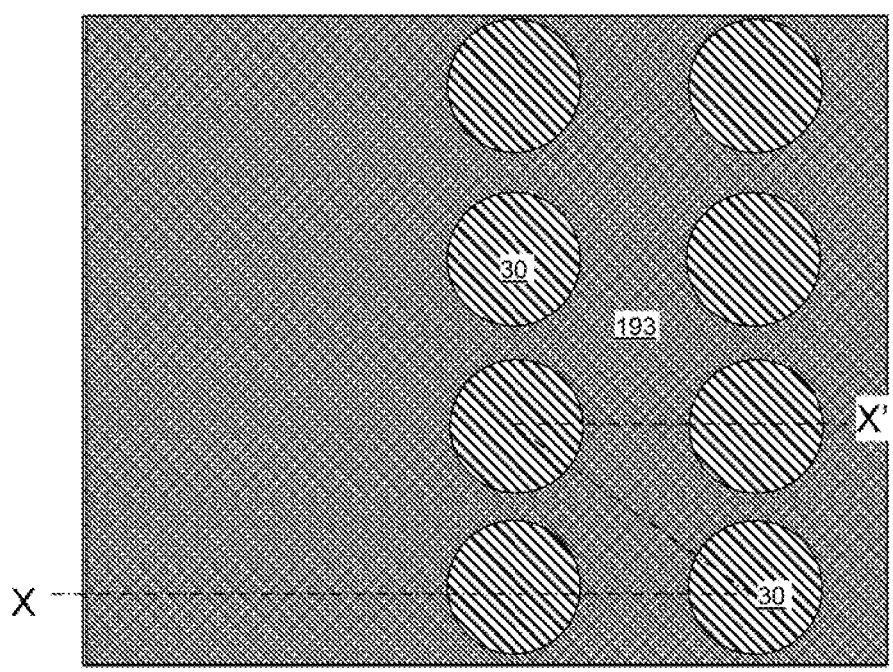
FIG. 5B is a top-down view of the contact region of the first exemplary structure of FIG. 5A. The zig-zag vertical plane X-X' is the plane of the vertical cross-sectional view of FIG. 5A.

FIGS. 5A and 5B illustrate portions of the contact region C and the peripheral region P after completion of vertical extension of upper contact via cavities 69A. After the last anisotropic etch process that provides the deepest upper contact via cavity 69A in the contact region C, each bottom surface of the upper contact via cavities 69A in the peripheral region P can be a horizontal surface of the second memory level dielectric layer 190B, the etch stop dielectric layer 192, or a respective one of the memory level peripheral region conductive structures 162P. Each of the upper contact via cavities 69A can have vertical sidewalls or tapered sidewalls. The width of the upper contact via cavities 69A, as measured at the bottom of the respective upper contact via cavity 69A between points with a maximum lateral separation distance, can be in a range from 50 nm to 500 nm, although lesser and greater thicknesses can also be employed.

Figure 6:
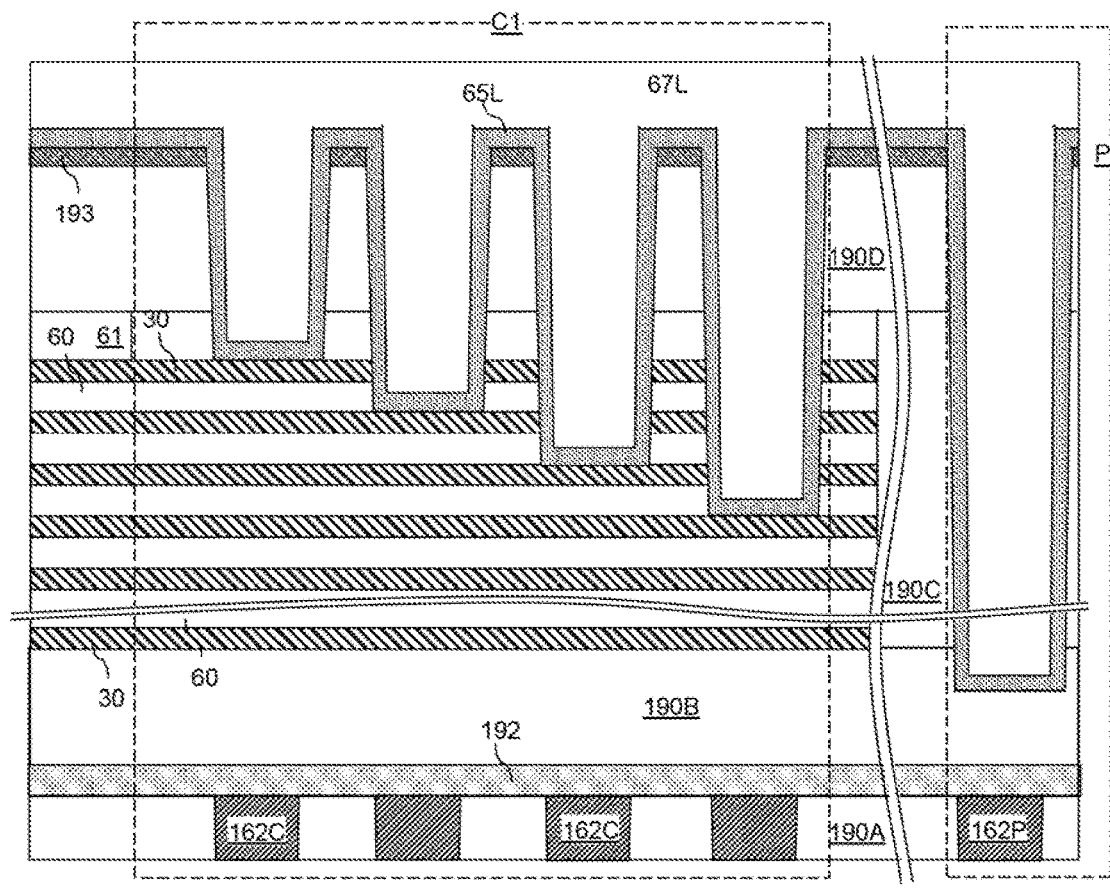
FIG. 6 is a vertical cross-sectional view of the contact region and the peripheral device region after formation of a dielectric liner layer and a dielectric fill material layer according to the first embodiment of the present disclosure.

Referring to FIG. 6, a dielectric liner layer 65L can be deposited within the upper contact via cavities 69A and over the memory level dielectric material layers (190A, 192, 190B, 190C, 190D, 193). The dielectric liner layer 65L includes a dielectric material that can be removed selective to the materials of the third memory level dielectric material layer 190D, the memory level dielectric material portion 190C, and the insulating layers 60. For example, the dielectric liner layer 65L can include silicon nitride. The dielectric liner layer 65L can be deposited by a conformal deposition method such as chemical vapor deposition. The thickness of the dielectric liner layer 65L can be in a range from 10 nm to 300 nm, such as from 30 nm to 100 nm, although lesser and greater thicknesses can also be employed.

A dielectric fill material layer 67L can be subsequently deposited in remaining volumes of the upper contact via cavities 69A and over the dielectric hard mask layer 193. The dielectric fill material layer 67L includes a dielectric material that is different from the material of the dielectric liner layer 65L. In one embodiment, the dielectric fill material layer 67L includes a second silicon oxide material that is different from the first silicon oxide material of the insulating layers 60. Specifically, the second silicon oxide material can be a silicate glass material having an etch rate in 100:1 dilute hydrofluoric acid that is at least twice the etch rate of the first silicon oxide material in 100:1 dilute hydrofluoric acid. In other words, the etch rate of the second silicon oxide material in dilute hydrofluoric acid including 1 weight percent of hydrofluoric acid in distilled water can be at least twice an etch rate of the first silicon oxide material in the dilute hydrofluoric acid.

In one embodiment, the second silicon oxide material of the dielectric fill material layer 67L can include a flowable silicon oxide material, which can be deposited, for example, by Eterna™ flowable CVD tool by Applied Materials, Inc®. Alternatively, the second silicon oxide material of the dielectric fill material layer 67L cam include a flowable oxide material, which is a silicon oxide based material including a high concentration of hydrogen and is deposited by spin coating. In one embodiment, the etch rate of the second silicon oxide material in 100:1 dilute hydrofluoric acid can be three times or more of the etch rate of the first silicon oxide material of the insulating layers 60. In one embodiment, the etch rate of the second silicon oxide material in 100:1 dilute hydrofluoric acid can be about four times or more of the etch rate of the first silicon oxide material of the insulating layers 60.

Figure 7:
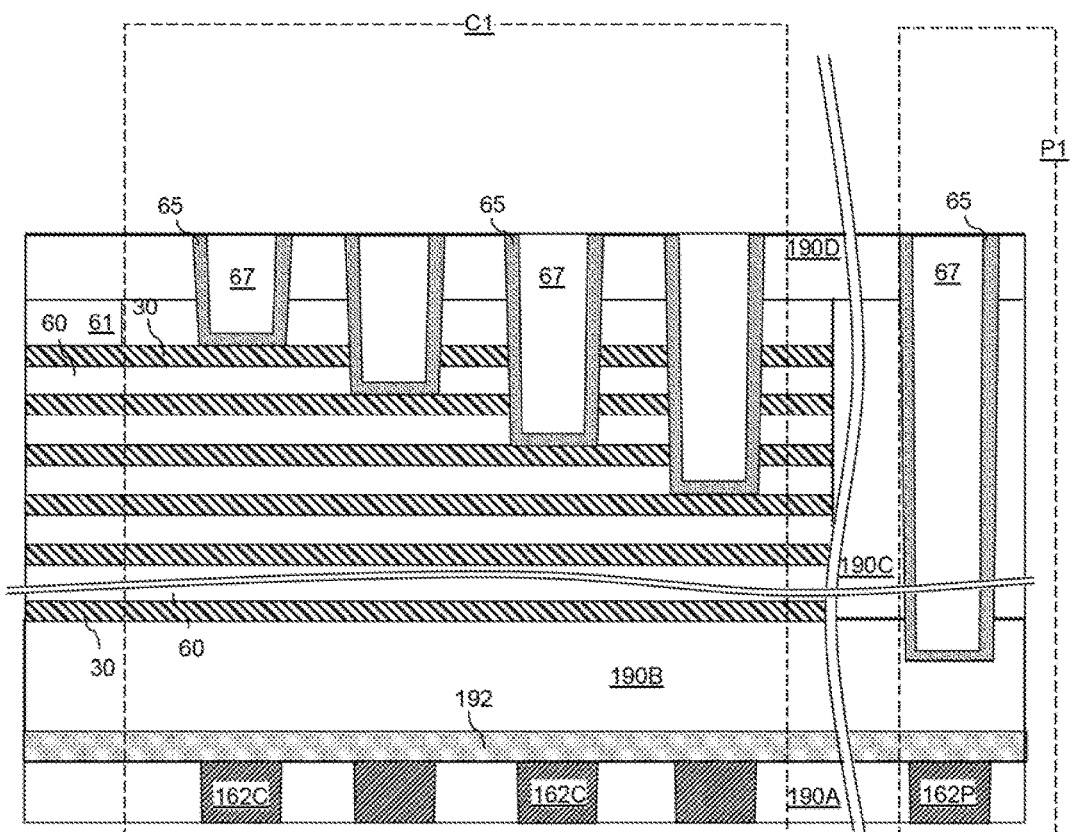
FIG. 7 is a vertical cross-sectional view of the contact region and the peripheral device region after formation of nested dielectric structures, each including a dielectric liner and a dielectric fill structure, according to the first embodiment of the present disclosure.

Referring to FIG. 7, a planarization process can be performed to remove portions of the dielectric fill material layer 67L and the dielectric liner layer 65L that overlies the hard mask layer 193. For example, chemical mechanical planarization (CMP) can be performed to remove the portions of the dielectric fill material layer 67L and the dielectric liner layer 65L overlying the hard mask layer 193. Optionally, the dielectric fill material layer 67L and the dielectric liner layer 65L may be recessed after the planarization process by a recess etch. If the recess etch is performed, the recess depth may be about the same as the thickness of the hard mask layer 193. Subsequently, the hard mask layer 193 can be removed. Optionally, another planarization process may be performed to provide planar top surfaces for the remaining portions of the third memory level dielectric material layer 190D, the dielectric fill material layer 67L, and the dielectric liner layer 65L.

A nested dielectric structure (65, 67) is formed in each of the upper contact via cavities 69A. Each nested dielectric structure (65, 67) includes a dielectric liner 65 which is a remaining portion of the dielectric liner layer 65L and a dielectric fill structure 67 which is a remaining portion of the dielectric fill material layer 67L. The dielectric fill structure 67 is embedded within the dielectric liner 65, and is laterally spaced from the third memory level dielectric material layer 190D and the insulating cap layer 61 by the dielectric liner 65.

Figure 8:
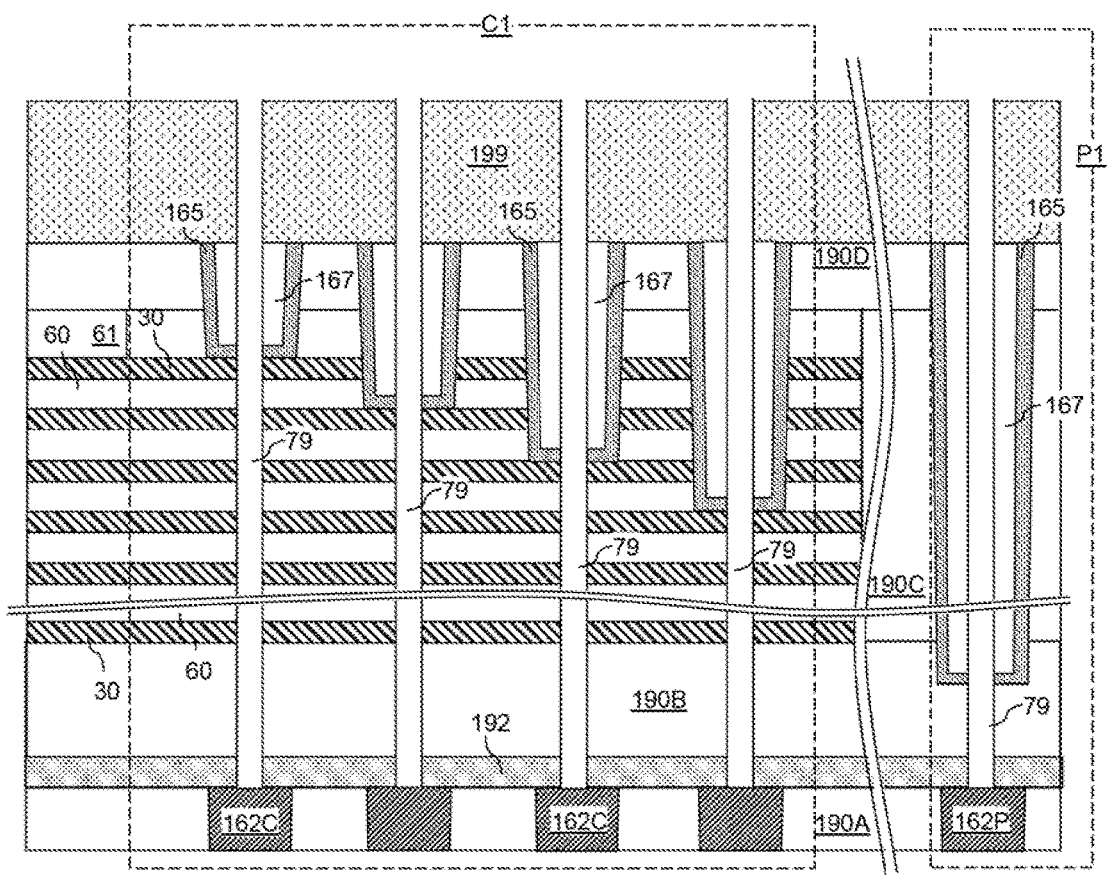
FIG. 8 is a vertical cross-sectional view of the contact region and the peripheral device region after formation of via cavities according to the first embodiment of the present disclosure.

Referring to FIG. 8, a photoresist layer 199 is applied over the first exemplary structure and is lithographically patterned to form an array of openings therein. Each of the openings can be located within a center portion of a respective one of the upper contact via cavity areas 101 illustrated in FIG. 3. Thus, each opening in the photoresist layer 199 overlies a respective one of the dielectric fill structures 67. The periphery of each opening in the photoresist layer 199 can be laterally offset inward from the upper periphery of the respective one of the dielectric fill structures 67 by a lateral offset distance.

An anisotropic etch process is performed to transfer the pattern of the openings through the nested dielectric structures (65, 67), the alternating stack (30, 60), the second memory level dielectric material layer 190B, and the etch stop dielectric layer 192, thereby forming via cavities 79. Each remaining portion of the dielectric fill structures 67 is herein referred to as a annular dielectric structure 167, through which a via cavity 79 extends vertically. Each remaining portion of the dielectric liners 65 includes a hole therein, and is herein referred to as a first dielectric spacer 165, or an outer dielectric spacer. Each annular dielectric structure 167 is laterally spaced from the third memory level dielectric material layer 190D by a respective first dielectric spacer 165. Sidewalls of a first dielectric spacer 165, a annular dielectric structure 167, the alternating stack (30, 60), the second memory level dielectric material layer 190B, and the etch stop dielectric layer 192 are physically exposed inside each via cavity 79. Further, a top surface of an underlying conductive structure, e.g., a memory level contact region conductive structures 162C, can be physically exposed at the bottom of each via cavity 79. The photoresist layer 199 can be subsequently removed, for example, by ashing.

Figure 9:
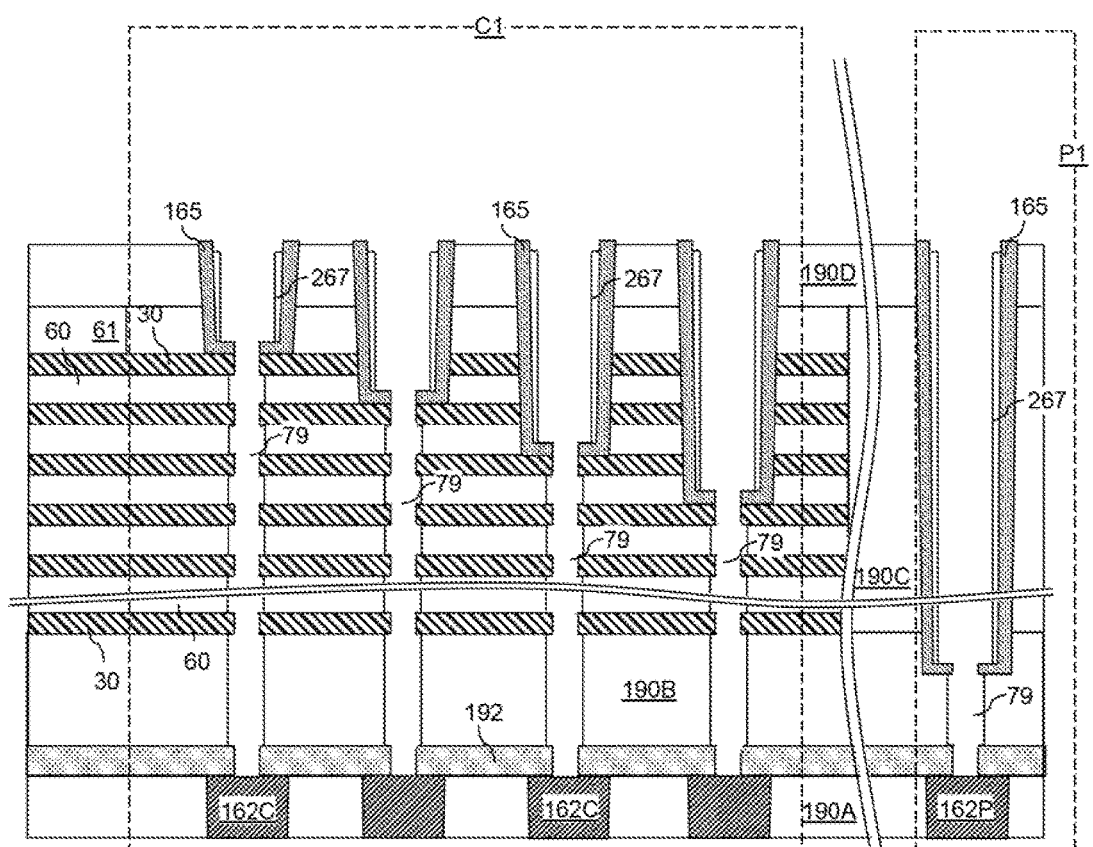
FIG. 9 is a vertical cross-sectional view of the contact region and the peripheral device region after etching the dielectric fill structures according to the first embodiment of the present disclosure.

Referring to FIG. 9, the material of the annular dielectric structures 167 (which is the same as the material of the dielectric fill structures 67 prior to formation of the via cavities 79) is isotropically etched around the via cavities 79 selective to the material of the first dielectric spacers 165. Specifically, the first silicon oxide material of the insulating layers 60 and the second silicon oxide material of the dielectric fill structure 67 are isotropically etched selective to the materials of the first dielectric spacers 165 and the electrically conductive layers 30. In one embodiment, the first dielectric spacers 165 include silicon nitride, and the electrically conductive layers 30 can include a metallic material or a doped semiconductor material. In this case, a wet etch process employing a dilute hydrofluoric acid or a vapor etch process employing HF vapor may be employed for the isotropic etch process. For example, a wet etch employing dilute hydrofluoric acid including 1 weight percent of hydrofluoric acid may be employed for the isotropic etch process.

As discussed above, the second silicon oxide material of the dielectric fill structures 67 has a greater etch rate than the first silicon oxide material of the insulating layers 60 in dilute hydrofluoric acid. Thus, surfaces of the annular dielectric structures 167 are isotropically recessed at a higher etch rate than sidewalls of the insulating layers 60. In one embodiment, etch rate of the surfaces of the annular dielectric structures 167 can be greater than the etch rate of the sidewalls of the insulating layers 60 by a factor of greater than two, and/or by a factor greater than three, and/or by a factor greater than four. The isotropic etch process is terminated before etching the entirety of the annular dielectric structures 167. For example, the duration of the isotropic etch process can be set such that the etch distance is in a range from 50% to 95% of the distance between the inner sidewall and the outer sidewall of an annular dielectric structures 167. The remaining portion of each annular dielectric structure 167 after thinning by the isotropic etch process is herein referred to as second dielectric spacer 267, or an intermediate dielectric spacer. The second dielectric spacer 267 exposes a horizontal portion of the first dielectric spacers 165. Each via cavity 79 is expanded by recessing the annular dielectric structures 167 and the insulating layers 60. The thickness of each first dielectric spacer 267, as measured between the inner sidewall and the outer sidewall, can be in a range from 3 nm to 100 nm, such as from 10 nm to 30 nm, although lesser and greater thicknesses can also be employed.

Figure 10A:
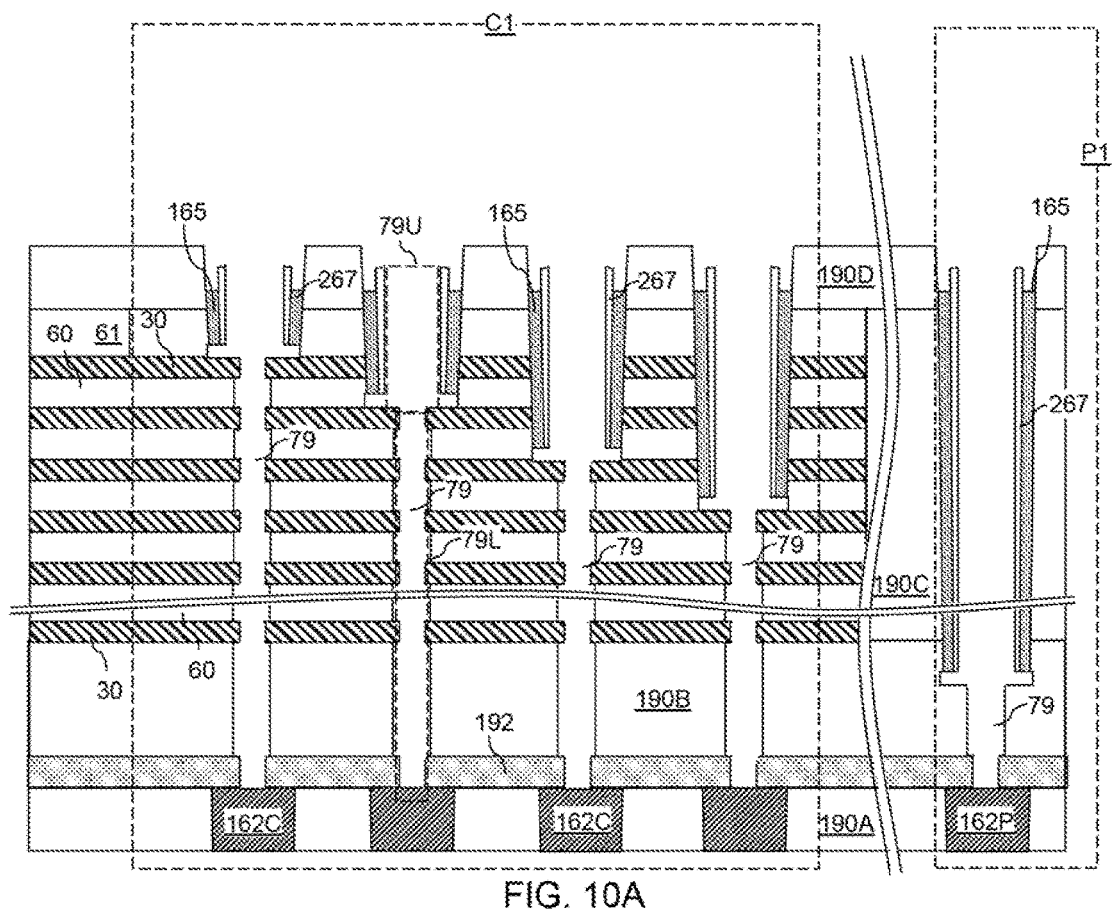
FIG. 10A is a vertical cross-sectional view of the contact region and the peripheral device region after laterally etching the dielectric liners underneath remaining portions of the dielectric fill structures to form via cavities according to the first embodiment of the present disclosure.
Figure 10B:
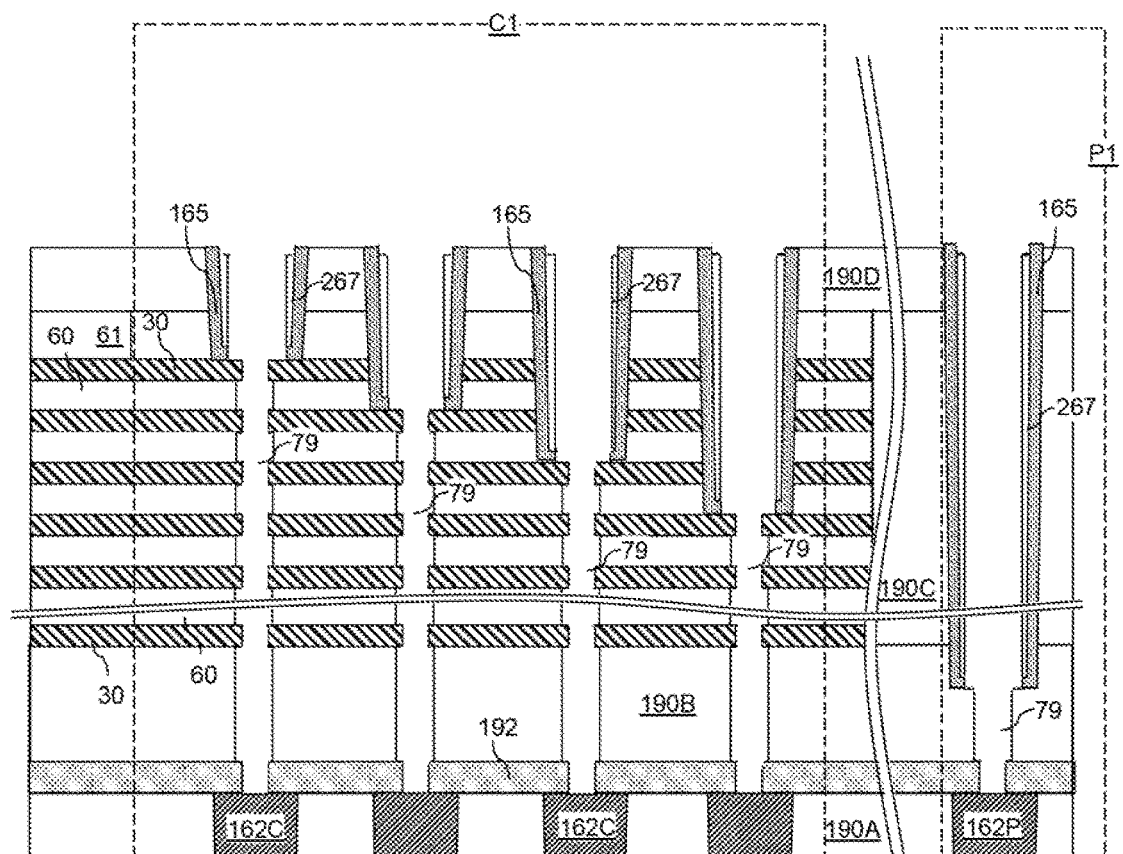
FIG. 10B is a vertical cross-sectional view of the contact region and the peripheral device region after anisotropically etching the dielectric liners exposed outside remaining portions of the dielectric fill structures to expose the electrically conductive layers according to an alternative configuration of the first embodiment of the present disclosure.

Referring to FIGS. 10A and 10B, the material of the first dielectric spacers 165 (i.e., the outer dielectric spacers), which is the same as the material of the dielectric liners 65, is selectively etched selective to the materials of the second dielectric spacers 267 (i.e., the intermediate dielectric spacers), and the electrically conductive layers 30. For example, as shown in FIG. 10A, the material of the first dielectric spacers 165 is isotropically laterally etched from underneath the second dielectric spacers 267 (which are remaining portions of the dielectric fill structures 67) to form annular recessed portions 79R of expanded via cavities 79. Thus, the material of the first dielectric spacers 165 is laterally etched from each of the via cavities 79. The first dielectric spacers 165 are collaterally etched from above. Each of the first dielectric spacers 165 and the second dielectric spacers 267 has a tubular configuration.

In an alternative method shown in FIG. 10B, the material of the first dielectric spacers 165 is selectively anisotropically etched using the second dielectric spacers 267 as a mask. Thus, the exposed horizontal portions of the first dielectric spacers 165 which protrude past the second dielectric spacers 267 into the via cavities 79 are removed during the anisotropic etching step to expose the top surface of a respective electrically conductive layer 30 in each via cavity. The final device which results from the etching method shown in FIG. 10B is illustrated in FIG. 15B and is described in more detail below.

Each first dielectric spacer 165 is a remaining portion of a dielectric liner 65 after various etch processes. Each second dielectric spacer 267 is a remaining portion of a dielectric fill structure 67 after an etch process. Each of the via cavities 79 comprises a lower cavity portion 79L extending through a respective subset of layers within the alternating stack (30, 60) and an upper cavity portion 79U having a greater width than the lower cavity portion 79L. The upper cavity portions 79U in volumes from which the material of the first dielectric spacers 165 (i.e., the material of the dielectric liners 65) is etched. The lower cavity portions 79L are formed in volumes located below a respective one of the nested dielectric structures. A lower dielectric spacer 64 is formed at a periphery of each of the lower cavity portions 79L.

Figure 11:
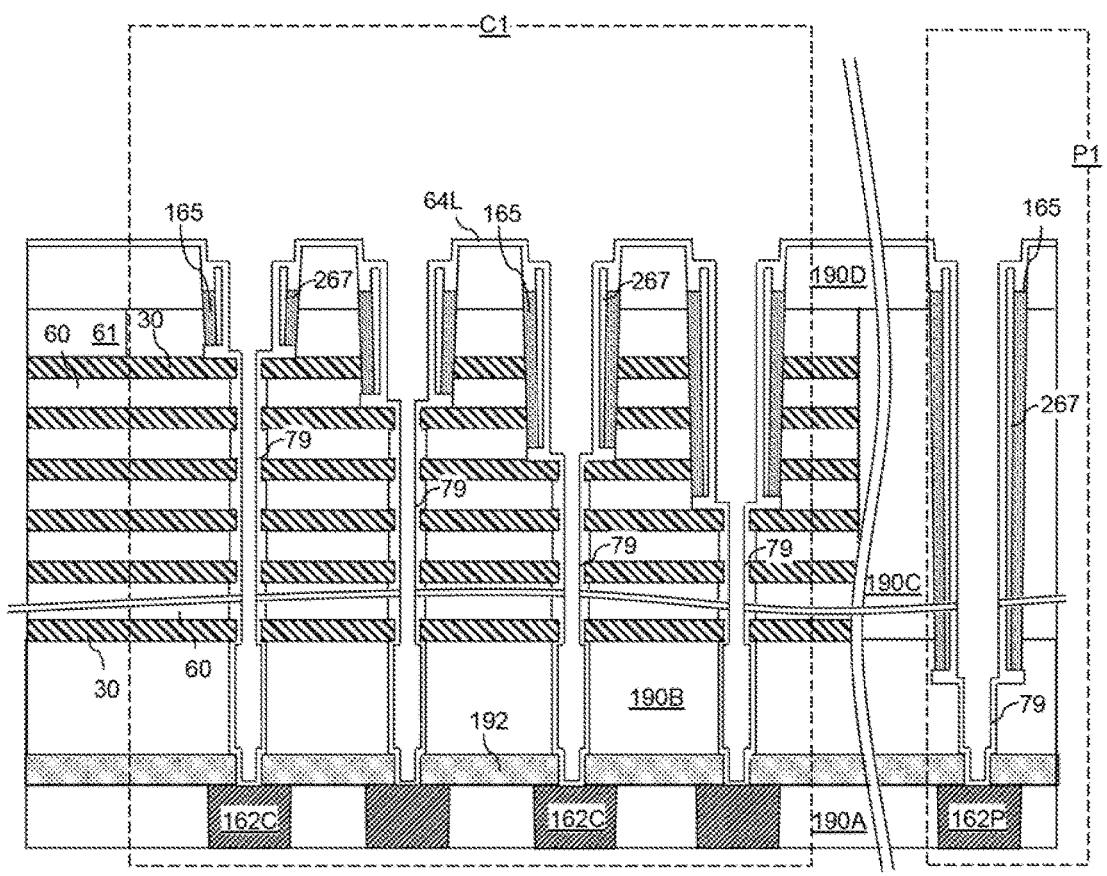
FIG. 11 is a vertical cross-sectional view of the contact region and the peripheral device region after deposition of a conformal dielectric liner layer according to the first embodiment of the present disclosure.

Referring to FIG. 11, a conformal dielectric liner layer 64L can be deposited at peripheral portions of the via cavities 79 and over the third memory level dielectric material layer 190D of FIG. 10A or FIG. 10B. The conformal dielectric liner layer 64L can be deposited by a conformal deposition process such as low pressure chemical vapor deposition (LPCVD) or atomic layer deposition. The conformal dielectric liner layer 46L includes a dielectric material that is different from the dielectric material of the first dielectric spacers 165. In one embodiment, the conformal dielectric liner layer 64L can include silicon oxide such as a TEOS oxide. The thickness of the conformal dielectric liner layer 64L can be in a range from 3 nm to 30 nm, such as from 6 nm to 15 nm, although lesser and greater thicknesses can also be employed.

Figure 12:
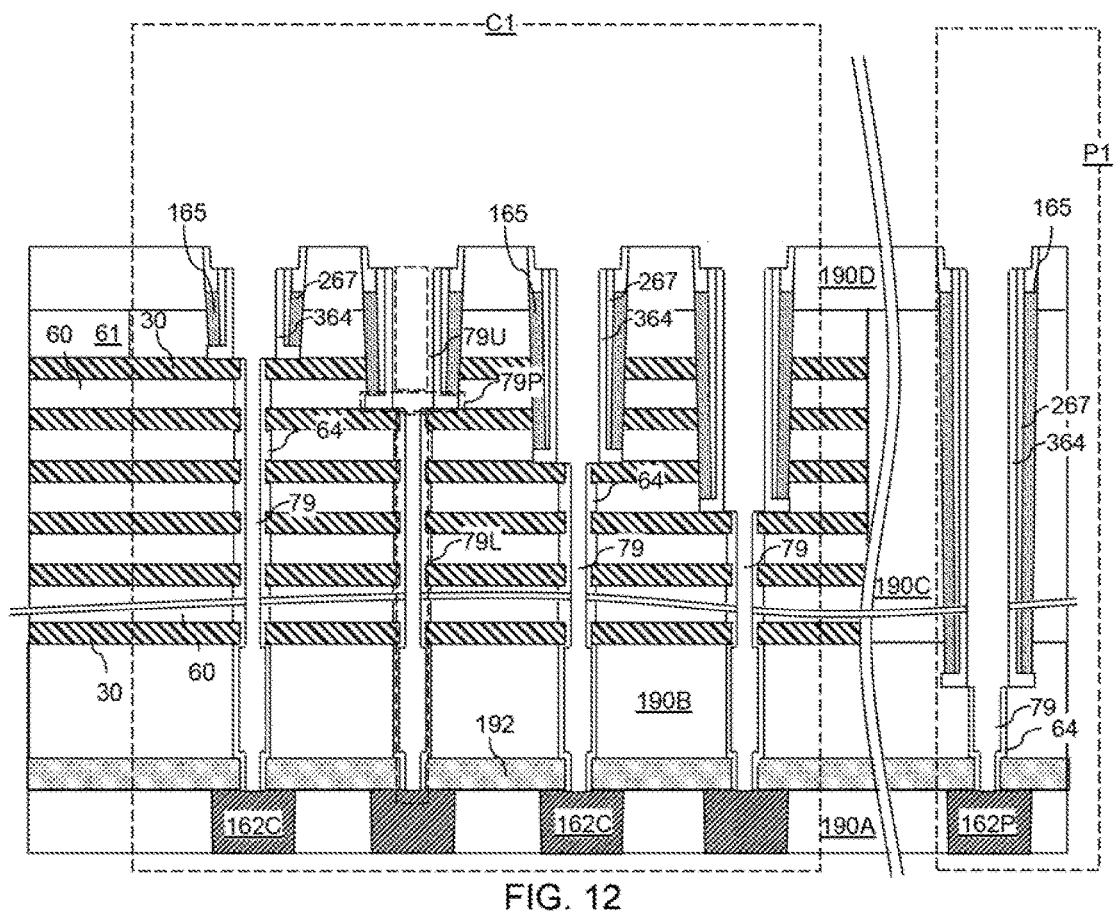
FIG. 12 is a vertical cross-sectional view of the contact region and the peripheral device region after anisotropically etching the conformal dielectric liner layer to form inner dielectric spacers and lower dielectric spacers according to the first embodiment of the present disclosure.

Referring to FIG. 12, the conformal dielectric liner layer 64L is anisotropically etched to remove horizontal portions thereof. Each remaining vertical portion of the conformal dielectric liner layer 64L located inside the second dielectric spacers 267 constitutes a third dielectric spacer 364, which is also referred to as an inner dielectric spacer. Each remaining portion of the conformal dielectric liner layer 64L that contacts the alternating stack (30, 60) is herein referred to as a lower dielectric spacer 64. This etch exposes the top surface of one respective electrically conductive layer (e.g., word line) 30 which is located at the boundary between the upper portion 79U and the lower portion 79L of each via cavity 79 (i.e., at a different device level in each respective via cavity 79).

Figure 13:
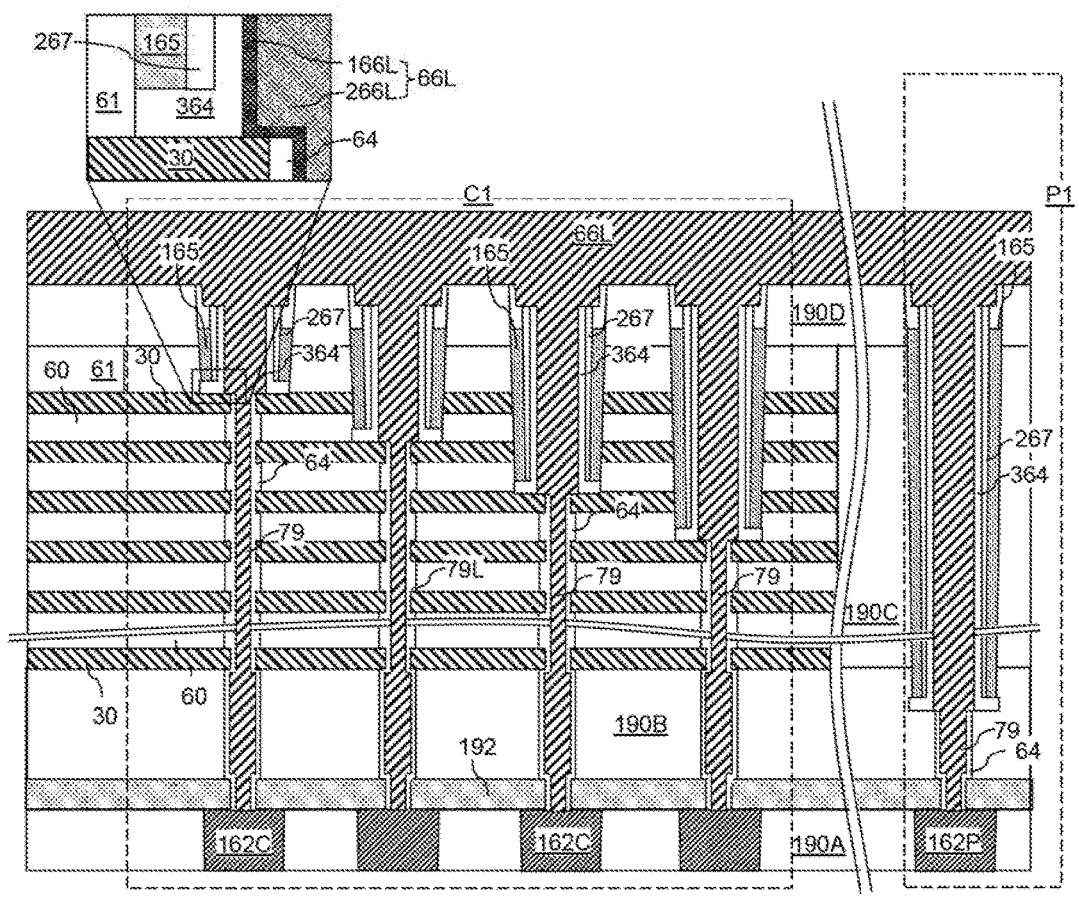
FIG. 13 is a vertical cross-sectional view of the contact region and the peripheral device region after deposition of conductive materials in the via cavities according to the first embodiment of the present disclosure.

Referring to FIG. 13, at least one conductive material is deposited within the via cavities 79 and over the third memory level dielectric material layer 190D to form at least one conductive material layer 66L. The at least one conductive material layer 66L can include, for example, a metallic liner layer 166L and a metallic fill material layer 266L. The metallic liner layer 166L can include a metallic diffusion barrier material and/or a metallic adhesion promotion material. For example, the metallic liner layer 166L can include at least one metallic nitride material such as TiN, TaN, and WN. The metallic liner layer 166L can be deposited by a conformal deposition method (such as chemical vapor deposition or electroplating) and/or non-conformal deposition method (such as physical vapor deposition). The thickness of the metallic liner layer 166L, as measured at vertical portions, can be in a range from 5 nm to 100 nm, although lesser and greater thicknesses can also be employed. The metallic fill material layer 266L can include an elemental metal, an intermetallic alloy, and/or a conductive metallic compound of at least one metal and at least one non-metallic element (such as nitrogen or carbon). For example, the metallic fill material layer 266L can include copper and/or tungsten. The metallic fill material layer 266L can be deposited by chemical vapor deposition or electroplating. In one embodiment, the metallic fill material layer 266L can consist essentially of copper or tungsten. The at least one conductive material layer 66L (e.g., the metallic liner layer 166L) contacts the exposed top surface of one respective electrically conductive layer (e.g., word line) 30 which is located at the boundary between the upper portion 79U and the lower portion 79L of each via cavity 79 (i.e., at a different device level in each respective via cavity 79).

Figure 14:
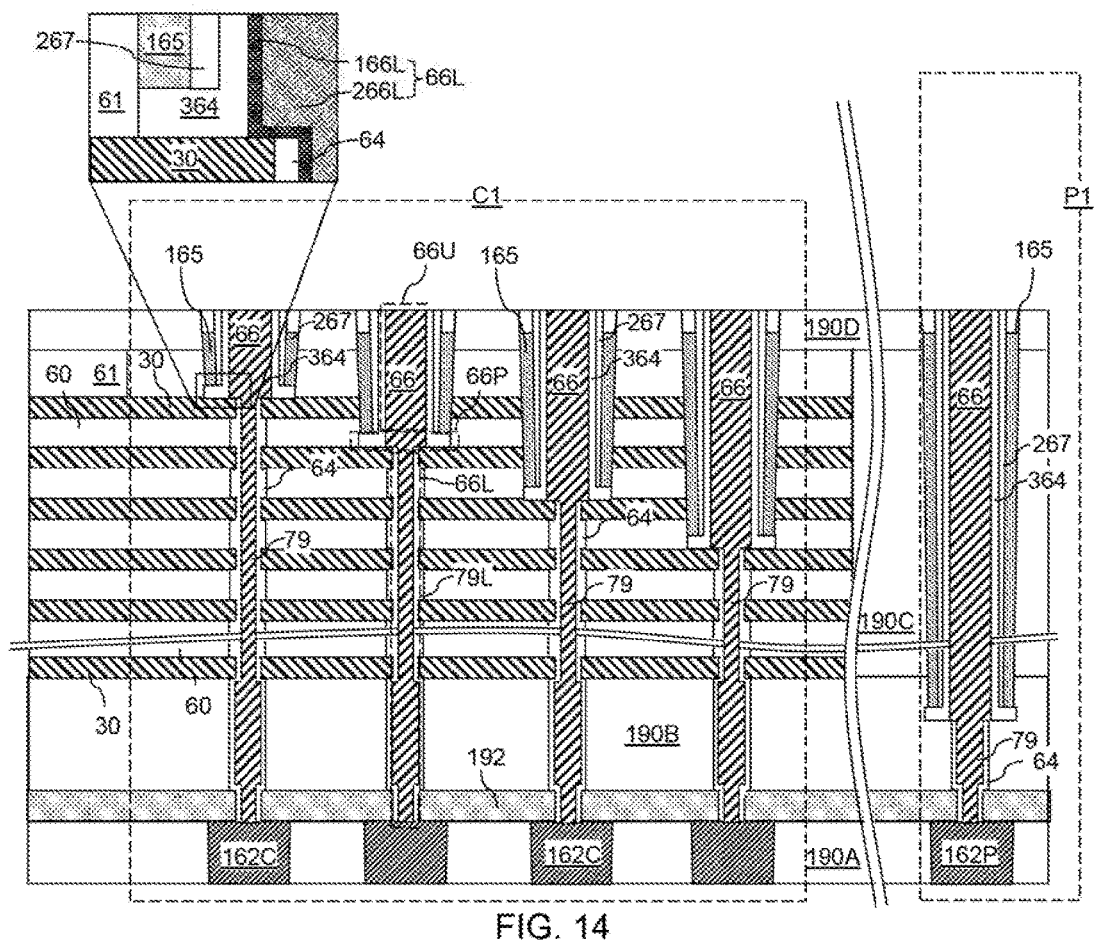
FIG. 14 is a vertical cross-sectional view of the contact region and the peripheral device region after formation of conductive via structures according to the first embodiment of the present disclosure.

Referring to FIG. 14, a planarization process can be performed to remove horizontal portions of the metallic fill material layer 266L and the metallic liner layer 166L from above the third memory level dielectric material layer 190D. The planarization process can employ chemical mechanical planarization (CMP) and/or a recess etch. After the top surface of the third memory level dielectric material layer 190D is physically exposed, the planarization process can proceed further to remove each portion of the metallic fill material layer 266L and the metallic liner layer 166L that overlies the first dielectric spacers 165. In this case, the materials of the third memory level dielectric material layer 190D can be vertically recessed until the recessed top surfaces of the third memory level dielectric material layer 190D is at, or below, the top surfaces of the first dielectric spacers 165 as provided at the processing steps of FIG. 13. Top portions of the second and third dielectric spacers (267, 364) can be recessed during the planarization process. Thus, the top surfaces of the third memory level dielectric material layer 190D, the first, second, and third dielectric spacers (165, 267, 364), and remaining portions of the at least one conductive material layer 66L can be within a same horizontal plane. Each adjoining set of the first, second, and third dielectric spacers (165, 267, 364) constitutes an upper dielectric spacer 62 illustrated in FIG. 1.

Each remaining portion of the at least one conductive material layer 66L constitutes a conductive via structure 66. Each conductive via structure 66 includes an upper portion 66U that contacts a top surface of a respective one of the electrically conductive layers 30 and a lower portion 66L that underlies, and is adjoined to, upper portion 66U and contacts a top surface of a respective one of the conductive structures (162C, 162P) and is electrically insulated from a respective subset of the electrically conductive layers 30 that is located between the respective one of the electrically conductive layers 30 and the conductive structures, i.e., the memory level contact region conductive structures 162C. Each conductive via structure 66 can be formed as an integral structure (i.e., a single continuous structure).

Each conductive via structure 66 is formed directly on a respective one of the electrically conductive layers 30. Specifically, each conductive via structure 66 is formed directly on a top surface of a respective one of the electrically conductive layers 30 exposed in each upper portion 79U of the respective via cavity 79, and directly on a top surface of a respective one of the conductive structures 162C exposed at the bottom of the respective via cavity 79, and is electrically insulated by the lower dielectric spacers 64 from a respective subset of the electrically conductive layers 30 that is located between the respective one of the electrically conductive layers 30 (i.e., the one that the conductive via structure 66 physically contacts) and the conductive structures 162C. The conductive structures 66 are formed on horizontal surfaces of the electrically conductive layers 30 within the contact region C.

Each conductive via structure 66 can include a metallic liner 166 and a conductive fill material portion 266. Each metallic liner 166 can contact an inner sidewall of a lower dielectric spacer 64, a top surface of an electrically conductive layer (e.g., word line) 30 and an inner sidewall of the third dielectric spacer 364.

Figure 15A:
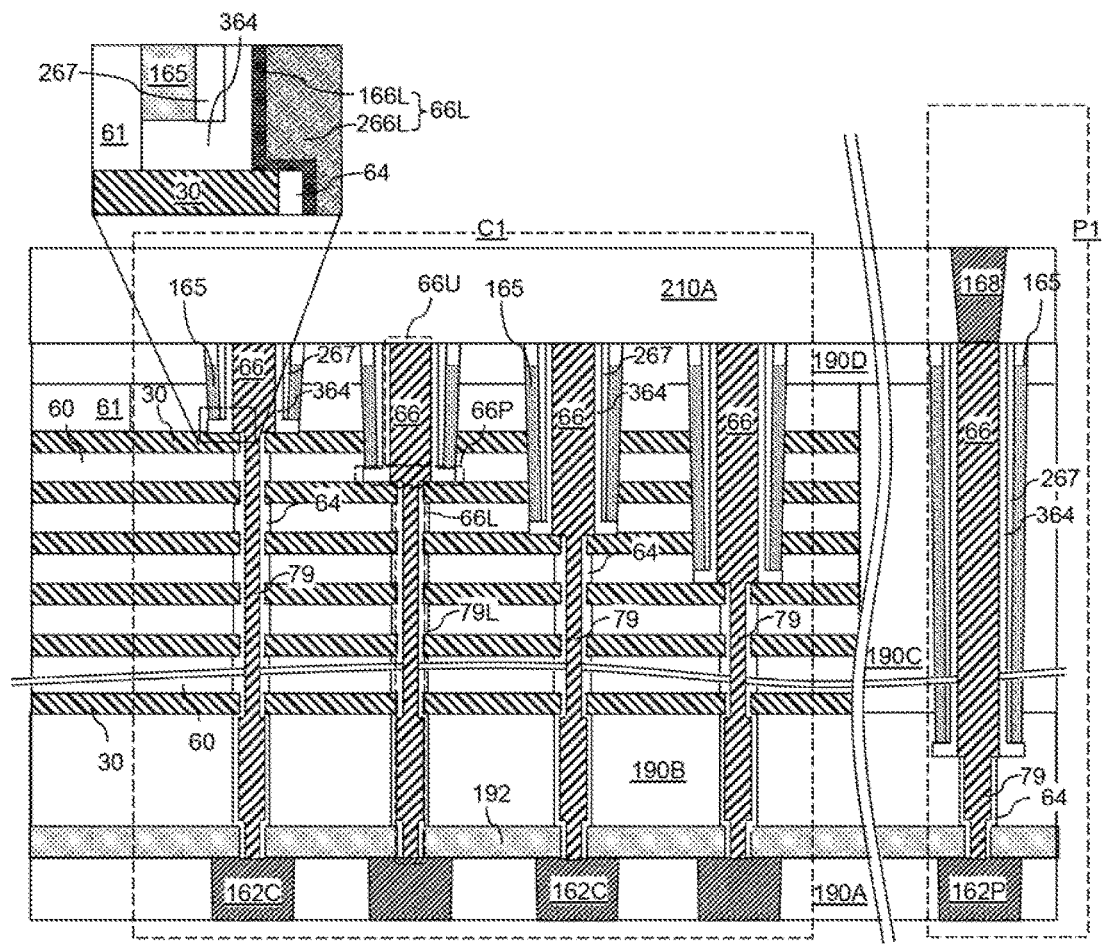
FIG. 15A is a vertical cross-sectional view of the contact region and the peripheral device region after formation of upper metal interconnect structures according to the first embodiment of the present disclosure.
Figure 15B:
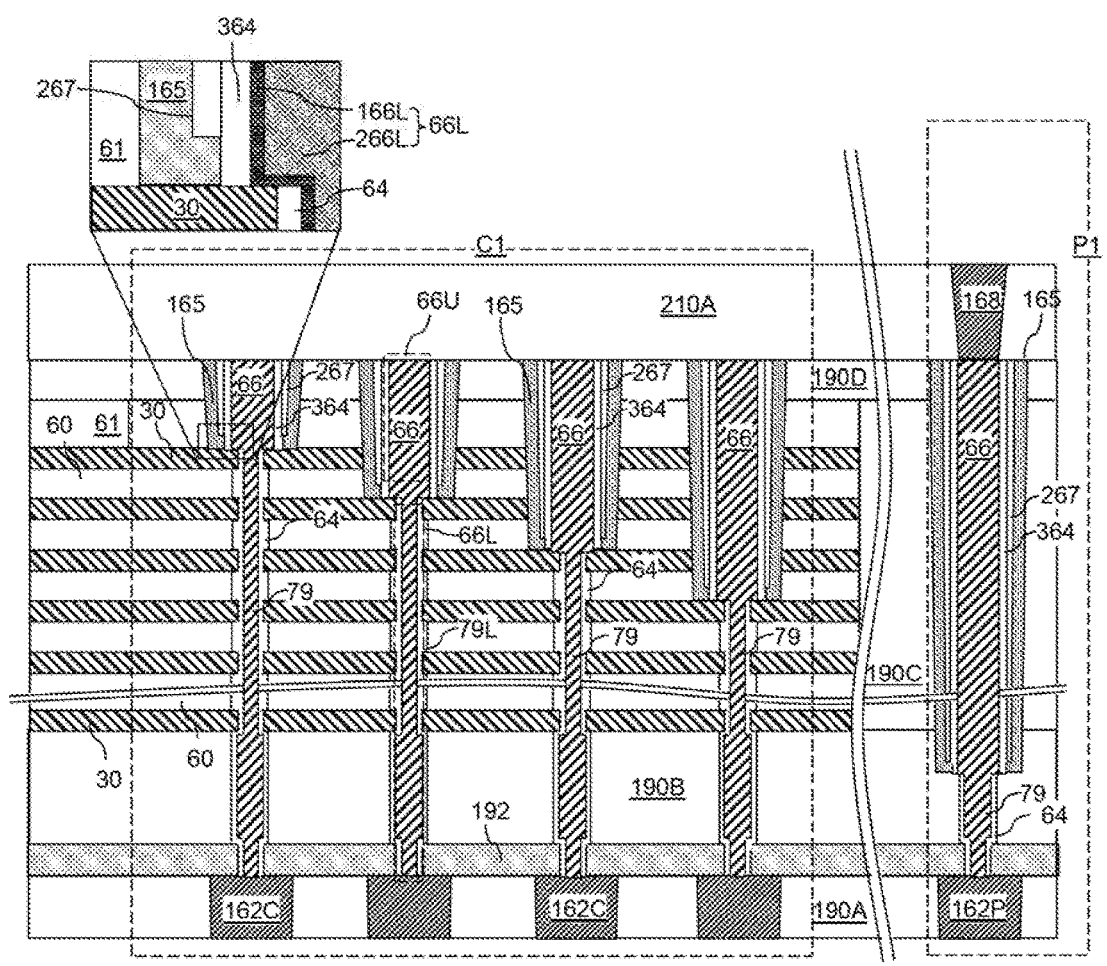
FIG. 15B is a vertical cross-sectional view of the contact region and the peripheral device region after formation of upper metal interconnect structures according to the alternative configuration of the first embodiment of the present disclosure.
Figure 16A:
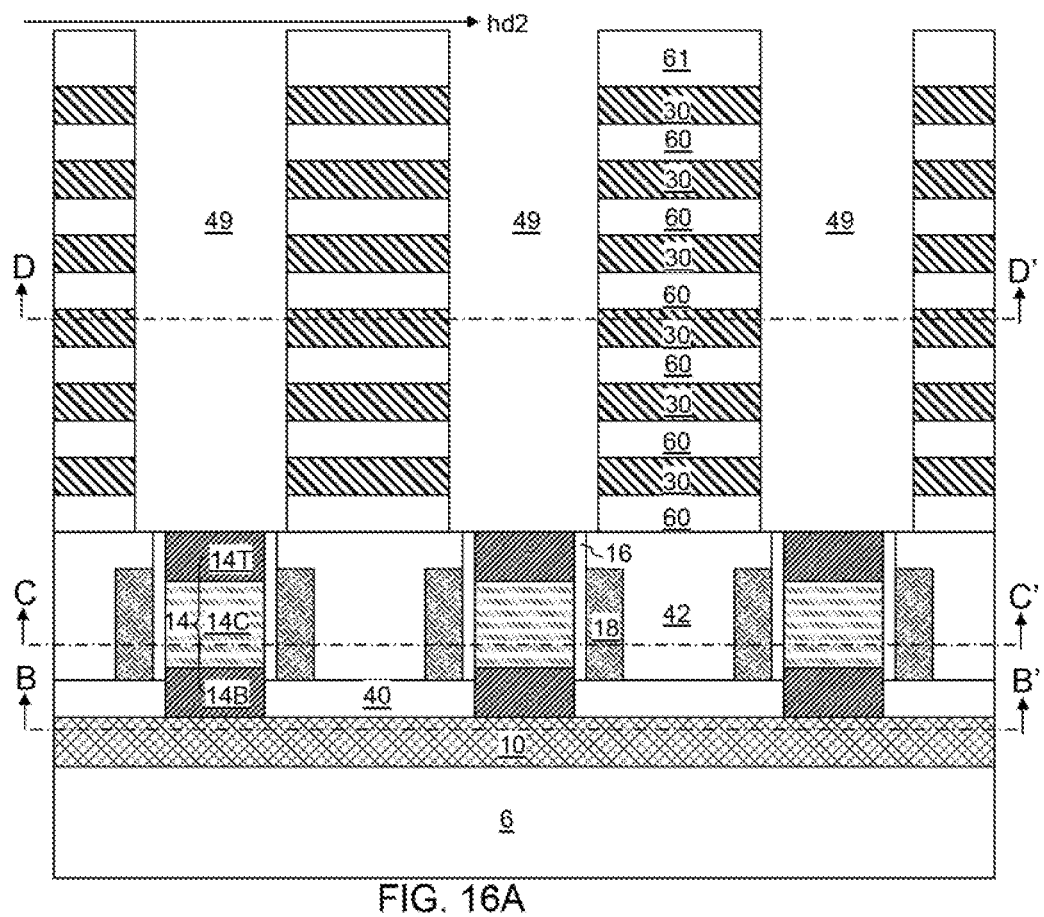
FIG. 16A is a vertical cross-sectional view of an array region of the first exemplary structure for forming a resistive random access memory device after formation of bit line access transistors, a dielectric fill layer, and a patterned alternating stack of insulating layers and conductive material layers according to a first embodiment of the present disclosure.
Figure 16B:
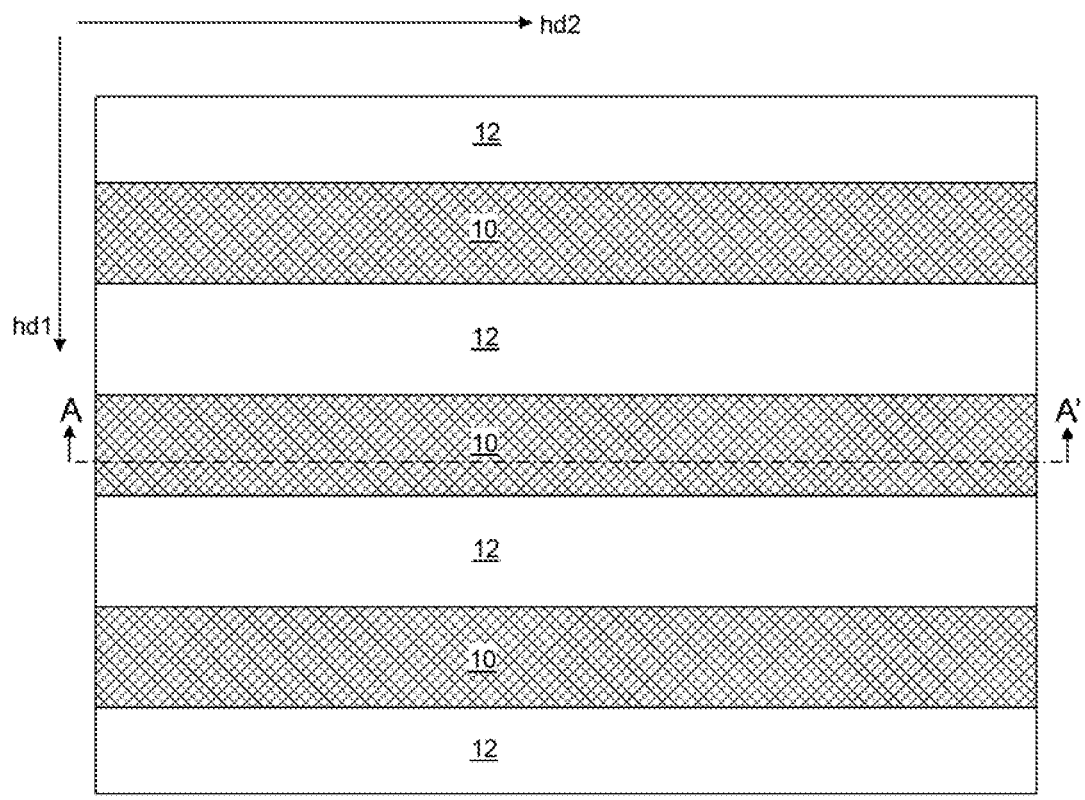
FIG. 16B is a horizontal cross-sectional view of the array region of the first exemplary structure of FIG. 16A along the horizontal plane B-B'. The vertical plane A-A' is the plane of the cross-section for FIG. 16A.
Figure 16C:
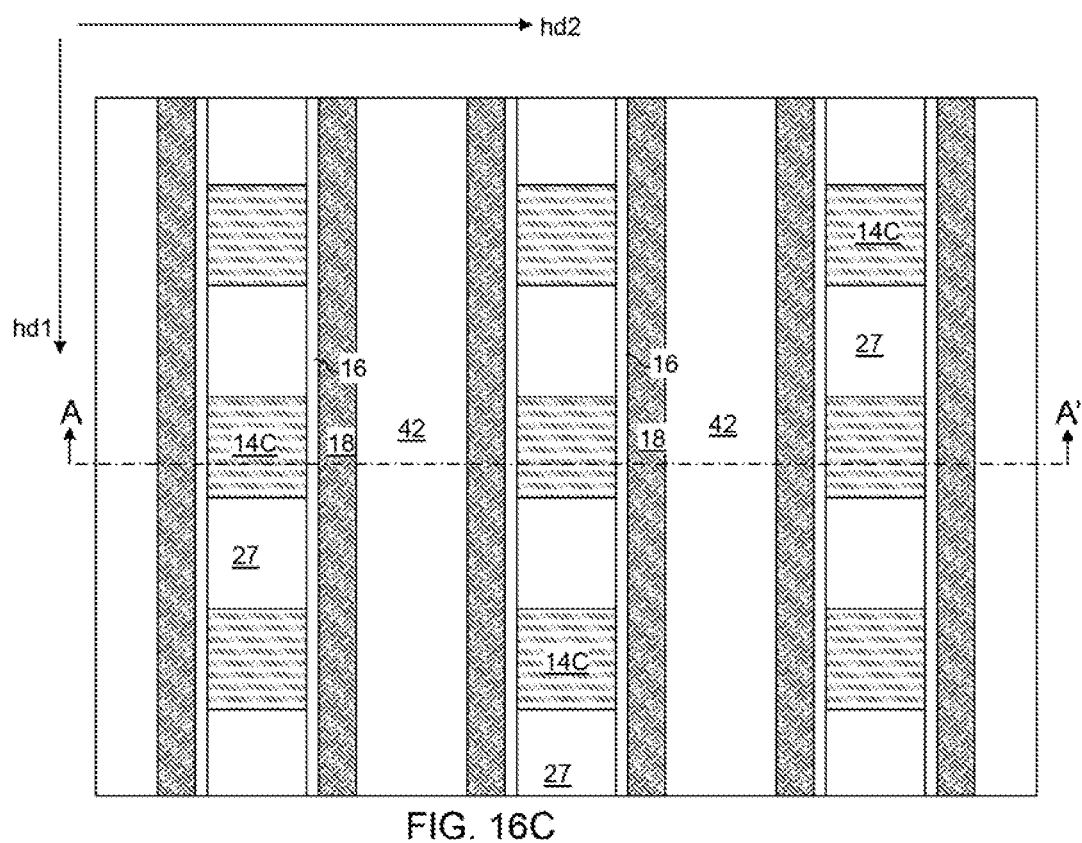
FIG. 16C is a horizontal cross-sectional view of the array region of the first exemplary structure of FIG. 16A along the horizontal plane C-C'. The vertical plane A-A' is the plane of the cross-section for FIG. 16A.
Figure 16D:
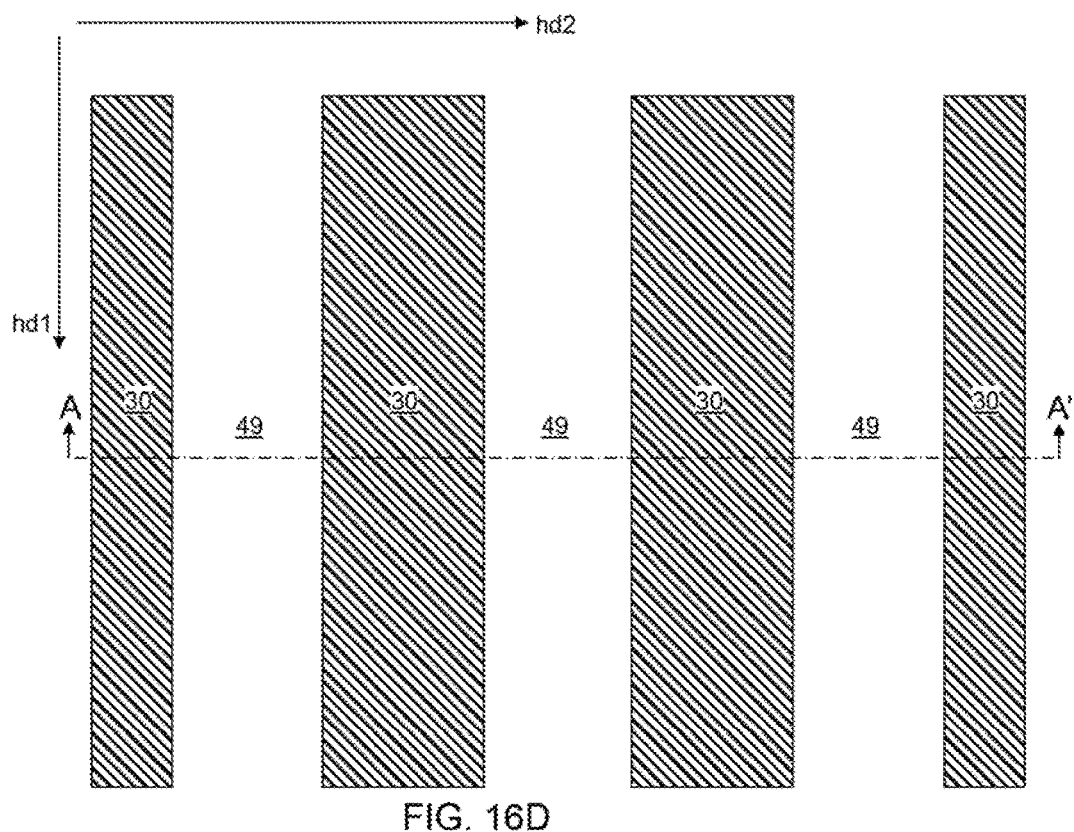
FIG. 16D is a horizontal cross-sectional view of the array region of the first exemplary structure of FIG. 16A along the horizontal plane D-D'. The vertical plane A-A' is the plane of the cross-section for FIG. 16A.

Referring to FIGS. 15A and 15B, a first upper interconnect level dielectric material layer 210A can be formed over the third memory level dielectric material layer 190D as a component of the upper interconnect level dielectric material layers 210. Upper interconnect level via structures 168 can be formed within the first upper interconnect level dielectric material layer 210A. As shown in FIG. 15A, the bottom surfaces of the first 165 and second 267 dielectric spacers contact the top horizontal surface of the third dielectric spacer 364 if the isotropic etch step is previously performed as shown in FIG. 10A. Alternatively, as shown in FIG. 15B, the bottom horizontal portion of the first dielectric spacer 165 contacts the bottom surface of the second dielectric spacer 267 and an outer side surface of the third dielectric spacer 364 if the anisotropic etch step is previously performed as shown in FIG. 10B.

FIGS. 16A-16D, 17A, 17B, 18A, 18B, 19A, and 19B illustrate the process of forming a vertical bit line type resistive random access memory device that is incorporated into the first exemplary structures of FIGS. 1A and 1B. Vertical bit lines and resistive memory elements are formed such that the resistive memory elements are located adjacent to each of the vertical bit lines and at each level of the electrically conductive layers 30 within the alternating stack (30, 60). In this case, a three-dimensional memory device thereby formed incorporates a resistive random access memory device. While incorporation of the resistive random access memory device into the array region A of the first exemplary structure is illustrated herein, it is understood that the present invention can be employed to incorporate any other type of three-dimensional memory device employed an alternating stack of insulating layers 60 and electrically conductive layers 30 and memory structures vertically extending through the alternating stack (30, 60).

Referring to FIGS. 16A-16D, the array region A of the first exemplary structure of FIG. 1A or 1B includes a memory level bottom dielectric layer 6, which may, or may not, be the same as the first memory level dielectric material layer 190A. Global bit lines 10 are formed over the memory level bottom dielectric layer 6. The global bit lines 10 can be a subset of the memory level array region conductive structures 162A and/or the lower level interconnect structures 170 illustrated in FIGS. 1A and 1B. The global bit lines 10 are parallel electrically conductive lines that are laterally spaced apart in a first horizontal direction hd1, and extending in a second horizontal direction hd2. The global bit lines 10 can be formed, for example, by depositing at least one conductive material layer, and patterning the at least one conductive material layer employing a combination of lithographic methods and an anisotropic etch. The at least one conductive material layer can include, for example, at least one elemental metal (such as W, Co, Cu, and Al), a conductive doped semiconductor material, an intermetallic alloy including at least two elemental metals, a conductive metallic nitride, or a conductive metallic carbide. For example, the at least one conductive material layer can include a metallic barrier layer (such as a layer of TiN, TaN, or WN) and a metal layer (such as a layer of W, Ti, Ta, Cu, Al, or an alloy thereof). The space between the global bit lines 10 can be filled with a dielectric material (such as silicon oxide). The dielectric material can be subsequently planarized to remove excess portions from above a horizontal plane including the top surfaces of the global bit lines 10 to form separator dielectric material portions 12. Each global bit lines 10 and each separator dielectric material portions 12 can extend along the second horizontal direction hd2. A one-dimensional array of the global bit lines 10 and the separator dielectric material portions 12 can extend along the first horizontal direction hd2 with a periodicity that is equal to the sum of the width of a global bit line 10 and the width of a separator dielectric material portion 12. Alternatively, the one-dimensional array of the global bit lines 10 and the separator dielectric material portions 12 may be formed by depositing a dielectric material layer, forming trenches extending along the second horizontal direction hd2 and laterally spaced from one another along the first horizontal direction hd1, and filling the trenches with at least one conductive material to form the global bit lines 10 therein.

A two-dimensional array of select devices can be formed on the global bit lines 10 such that multiple select devices are formed on each global bit line 10. In one embodiment, the select devices can be transistor such as vertical thin film transistors employing a polycrystalline semiconductor channel. Examples of suitable transistors for the select devices are described, for example, in U.S. patent application Ser. No. 14/206,196, filed Mar. 12, 2014, which is incorporated by reference herein in its entirety. In case the select devices are field effect transistors, the select transistors are herein referred to access transistors.

Bit line access transistors are subsequently formed on global bit line 10. Each access transistor can be a vertical field effect transistor, and can include a bottom active region 14B (which can be a source region or a drain region), a semiconductor channel 14C, and a top active region 14T (which can be a drain region if the underlying bottom active region 14B is a source region, and a source region if the underlying bottom active region 14C is a drain region). As used herein, an "active region" refers to a source region or a drain region.

The bit line access transistors can be formed by forming a semiconductor portion stack 14 including a first doped semiconductor layer for forming the bottom active regions 14B, a semiconductor channel material layer for forming the semiconductor channels 14C, and a second doped semiconductor layer for forming the top active regions 14T, which has a same type of doping as the first doped semiconductor layer. The semiconductor portion stack 14 is patterned employing a combination of lithographic methods and an anisotropic etch such that each patterned portion of the semiconductor portion stack 14 overlies an area of a respective global bit line 10 and is laterally spaced from one another by trenches extending along the second horizontal direction hd2. Subsequently, a dielectric material (such as silicon nitride and/or silicon oxide) is deposited in the trenches and planarized to remove the dielectric material from above rails of the semiconductor portion stack 14 that extend along the second horizontal direction hd2. The remaining portions of the semiconductor portion stack 14 and the planarized dielectric material portions constitute alternating rail structures in which rails of semiconductor portion stack 14 and rails of the planarized dielectric material extend along the second horizontal direction hd2 and alternate along the first horizontal direction hd1.

The remaining portions of the semiconductor portion stack 14 and the planarized dielectric material portions are patterned to form trenches that extend along the first horizontal direction hd1. Each patterned portion of the semiconductor portion stack 14 includes a vertical stack of a bottom active region 14B, a semiconductor channel 14C, and a top active region 14T. Each patterned portion of the dielectric material constitutes a dielectric pillar structure 27, which can be located between a pair of vertical stacks of a bottom active region 14B, a semiconductor channel 14C, and a top active region 14T that are spaced from each other along the first horizontal direction hd1. Each alternating sequence of dielectric pillar structures 27 and vertical stacks of a bottom active region 14B, a semiconductor channel 14C, and a top active region 14T that extend along the first horizontal direction hd1 forms a composite rail structure (14B, 14C, 14T, 27). The composite rail structures (14B, 14C, 14T, 27) are laterally spaced from one another along the second horizontal direction hd2. Top surfaces of the global bit lines 10 and the separator dielectric portions 12 can be physically exposed at the bottom of each trench that laterally extends along the first horizontal direction hd1.

A spacer dielectric layer 40 can be formed at the bottom the trenches by depositing a self-planarizing dielectric material (such as spin-on glass) or by filling the trenches with a dielectric material (such as organosilicate glass), planarizing the deposited dielectric material, and recessing the dielectric material selective to the dielectric pillar structures 27 and the vertical stacks of the bottom active regions 14B, the semiconductor channels 14C, and the top active regions 14T. Each spacer dielectric layer 40 can be formed over of the global bit lines 10 and the separator dielectric material portions 12 such that the top surface of the spacer dielectric layer 40 is located at a target height for placing a bottom edge of gate electrodes 18 to be subsequently formed. For example, the top surface of the spacer dielectric layer 40 can be at a level about the interface between the remaining portions of the first conductivity type semiconductor layer and the channel material layer.

The gate dielectrics 16 and the gate electrodes 18 of the access transistors can be subsequently formed, for example, by depositing a conformal gate dielectric layer (e.g., silicon oxide) and a conformal conductive material layer (e.g., heavily or degenerately doped polysilicon) in the trenches that separate the one-dimensional array of rail structures, and by anisotropically etching the conformal conductive material layer. The remaining vertical portions of the conformal conductive material layer constitute the gate electrodes 18, which extend along the first horizontal direction hd1. Each remaining portion of the conformal gate dielectric layer constitutes a gate dielectric 16. Each gate electrode 18 is laterally spaced from an adjacent rail structure by a vertical portion of a gate dielectric 16.

Remaining volumes of the trenches are filled with at least one dielectric material. Excess portions of the at least one dielectric material can be removed from above the horizontal plane including the top surfaces of the rail structures (which include contiguous portions of the semiconductor portion stack 14 and the dielectric pillar structures 27 that are present between a pair of trenches) by a planarization process, which can employ, for example, chemical mechanical planarization. Each remaining portion of the deposited dielectric material in the trenches constitutes a dielectric rail structure 42.

Each dielectric rail structure 42 extends along the first horizontal direction hd1 parallel to the composite rail structures (14B, 14C, 14T, 27). Each composite rail structure (14B, 14C, 14T, 27) includes remaining portions of the semiconductor portion stack 14 and the dielectric pillar structures 27 between a neighboring pair of dielectric rail structures 42. Each dielectric rail structure 42 can have a substantially vertical bottom portion, or can have a tapered bottom portion in which the width of the dielectric rail structure 42 monotonically or strictly increases as a function of a vertical distance from the memory level bottom dielectric layer 6. In one embodiment, each dielectric rail structure 42 can include at least one dielectric material such as silicon nitride and/or silicon oxide. The dielectric rail structures 42 and the composite rail structures (14T, 14C, 14B, 27) alternate along the second horizontal direction hd2.

Subsequently, an alternating stack of spacer material layers and insulating layers 60 can be formed over the one dimensional array of the dielectric rail structures 42 and the composite rail structures (14B, 14C, 14T, 27). An insulating cap layer 61 can be formed over the alternating stack. In one embodiment, the spacer material layers can be electrically conductive layers 30 that remain in a final device structure. In another embodiment, the spacer material layers can be sacrificial material layers that are subsequently replaced electrically conductive layers, as will be described in more detail below. In one embodiment, the insulating cap layer 61 can include a dielectric material that is different from the dielectric material of the insulating layers 60. For example, the insulating layers 60 can include undoped silicate glass (e.g., silicon oxide) or doped silicate glass, and the insulating cap layer 61 can include silicon nitride or a dielectric metal oxide.

As used herein, an alternating stack of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of the electrically conductive layers and the insulating layers may begin with an instance of the electrically conductive layers or with an instance of the insulating layers, and may terminate with an instance of the electrically conductive layers or with an instance of the insulating layers. In one embodiment, an instance of the first elements and an instance of the second elements may form a unit that is repeated with periodicity within the alternating plurality.

Subsequently, the insulating cap layer 61 and the alternating stack of the electrically conductive layers 30 and the insulating layers 60 can be patterned to form line trenches 49 that extend along the first horizontal direction hd1. Each line trench 49 can overlie the area of a respective composite rail structure (14B, 14C, 14T, 27). Each contiguous set of remaining portions of the electrically conductive layers 30 and the insulating layers 60 between a pair of line trenches 49 constitutes an alternating stack (30, 60) that is a rail structure. Each alternating stack (30, 60) overlies a respective dielectric rail structure 42, extends along the first horizontal direction hd1, and is laterally spaced apart from other alternating stacks (30, 60) along the second horizontal direction hd2. Each patterned electrically conductive layer 30 can constitute a word line of a resistive random access memory device. In one embodiment, each alternating stack (30, 60) can have a lesser width along the second horizontal direction hd2 than the underlying dielectric rail structure 42, and can be entirety within the area of the underlying dielectric rail structure 42.

In one embodiment, the electrically conductive layers 30 comprise a first electrically conductive material. In one embodiment, the first electrically conductive material can include an elemental metal, an intermetallic alloy, and/or a conductive metal nitride.

The thickness of the electrically conductive layers 30 can be in a range from 5 nm to 60 nm, although lesser and greater thicknesses can also be employed. The thickness of the insulating lines 60 can be in a range from 5 nm to 60 nm, although lesser and greater thicknesses can also be employed. The thickness of the insulating cap layer 61 can be in a range from 5 nm to 300 nm, although lesser and greater thicknesses can also be employed.

A pair of a conductive material layer 30 and an insulating layer 60 can constitute a unit of repetition in the alternating stack (30, 60) of the electrically conductive layers 30 and the insulating layers 60. The total number of repetitions can be in a range from 8 to 1,024, although lesser and greater number of repetitions can also be employed. Thus, a plurality of alternating stacks (30, 60) of insulating layers 60 and electrically conductive layers 30 is formed over a memory level bottom dielectric layer 6. Each of the insulating layers 60 and the electrically conductive layers 30 extends along the first horizontal direction (i.e., the word line direction) hd1. The alternating stacks (30, 60) are laterally spaced from one another along the second horizontal direction hd2 (i.e., the global bit line direction).

Figure 17A:
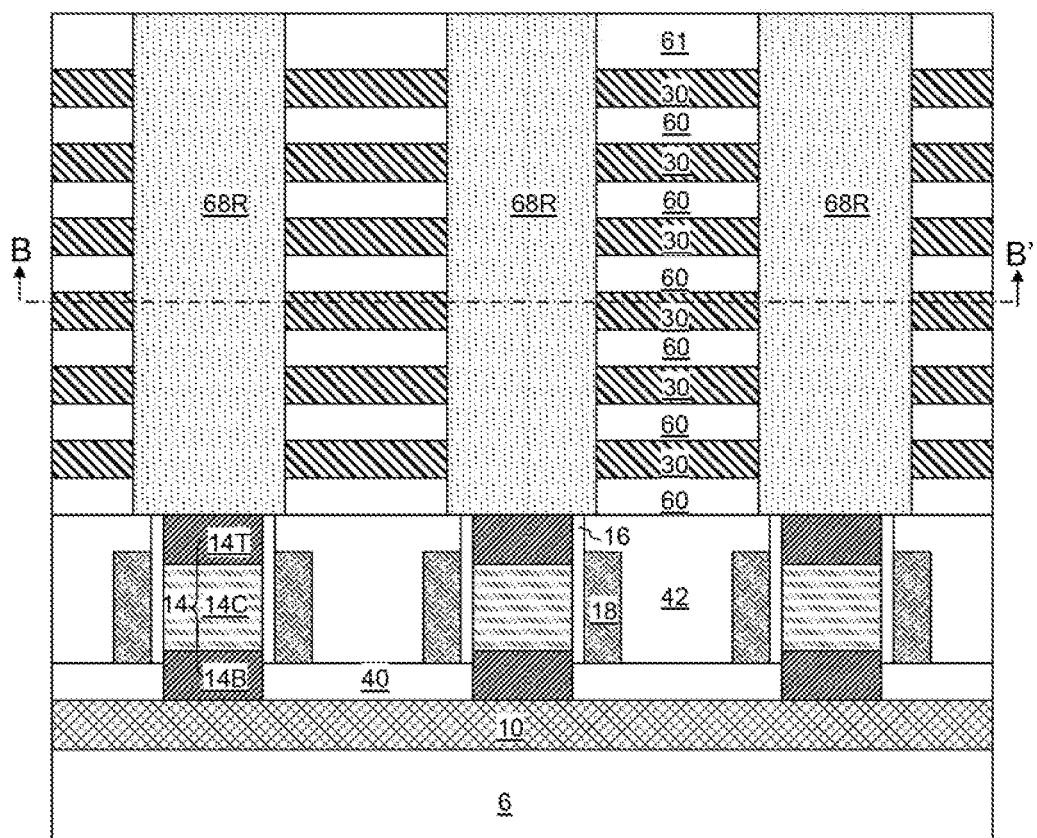
FIG. 17A is a vertical cross-sectional view of the array region of the first exemplary structure after formation of dielectric trench fill structures according to an embodiment of the present disclosure.
Figure 17B:
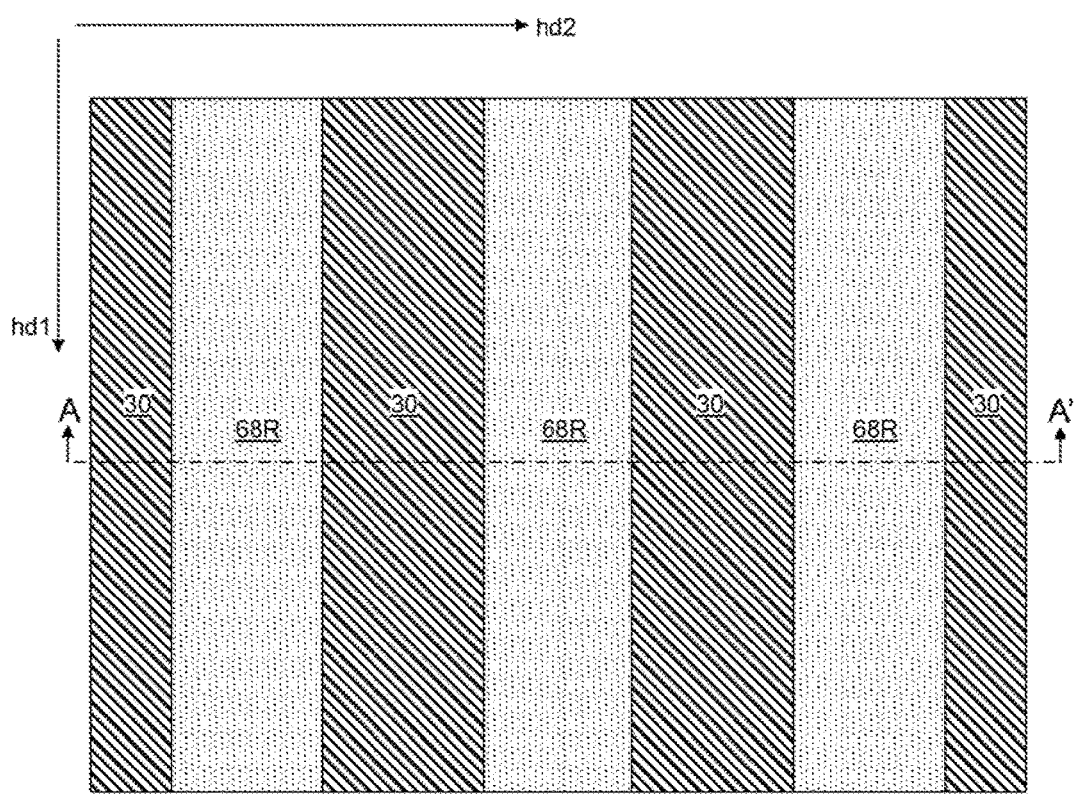
FIG. 17B is a horizontal cross-sectional view of the array region of the exemplary structure of FIG. 17A along the horizontal plane B-B'. The vertical plane A-A' is the plane of the cross-section for FIG. 17A.

Referring to FIGS. 17A and 17B, a dielectric material is deposited to fill the line trenches 49. The dielectric material can be removed from above a horizontal plane including the top surfaces of the insulating cap layers 61. Each remaining portion of the dielectric material filling a line trench 49 constitutes a dielectric rail structure, which is herein referred to as separator rail structures 68R. Each separator rail structure 68R extends along the first horizontal direction hd1. The alternating stacks (30, 60) and the separator rail structures 68R can form a one-dimensional array that extends along the second horizontal direction hd2. In one embodiment, the alternating stacks (30, 60) and the separator rail structures 68R can have a periodicity that is equal to the sum of the width of an alternating stack (30, 60) and the width of a separator rail structure 68R. The separator rail structures 68R includes a dielectric material such as doped silicate glass, undoped silicate glass (e.g., silicon oxide), silicon nitride, organosilicate glass, or porous derivatives thereof. In an illustrative example, the insulating layers 60 can include undoped silicate glass or doped silicate glass, the insulating cap layer 61 can include silicon nitride or a dielectric metal oxide, and the separator rail structures 68R can include doped silicate glass, undoped silicate glass, or organosilicate glass.

Figure 18A:
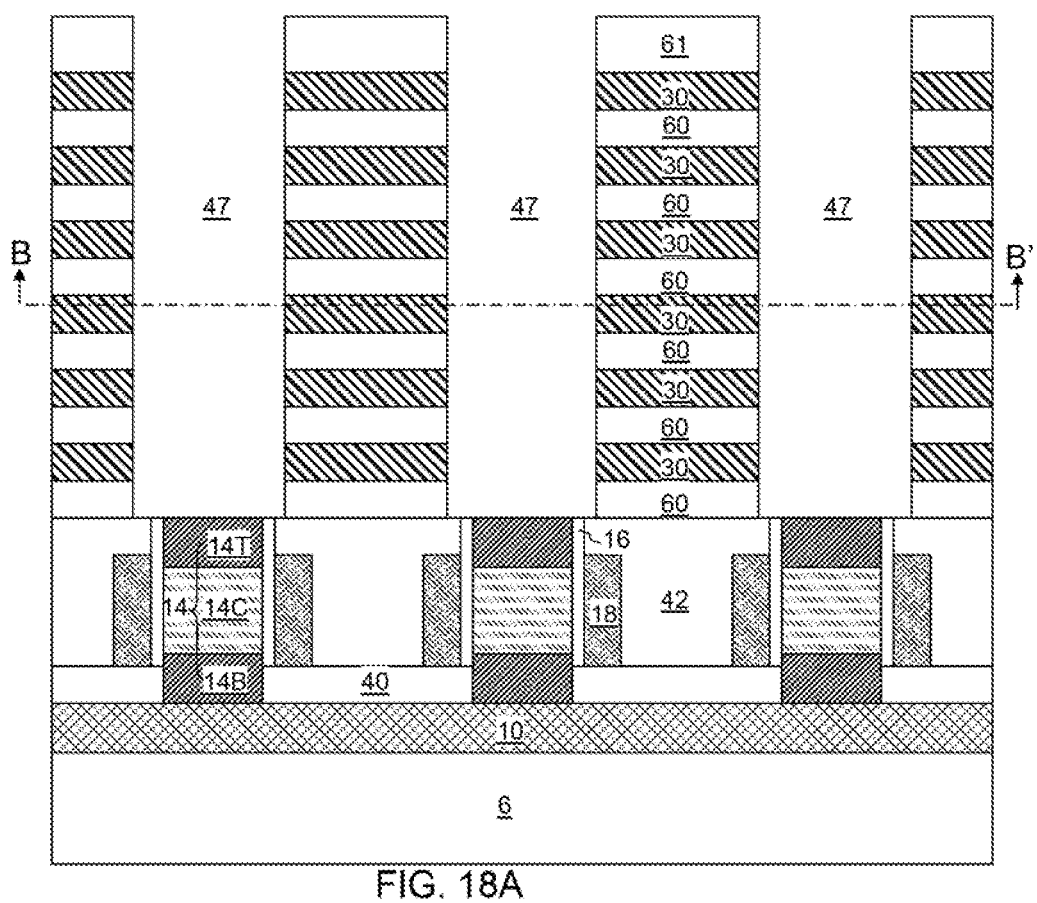
FIG. 18A is a vertical cross-sectional view of the array region of the first exemplary structure after formation of dielectric pillar structures and bit line openings according to an embodiment of the present disclosure.
Figure 18B:
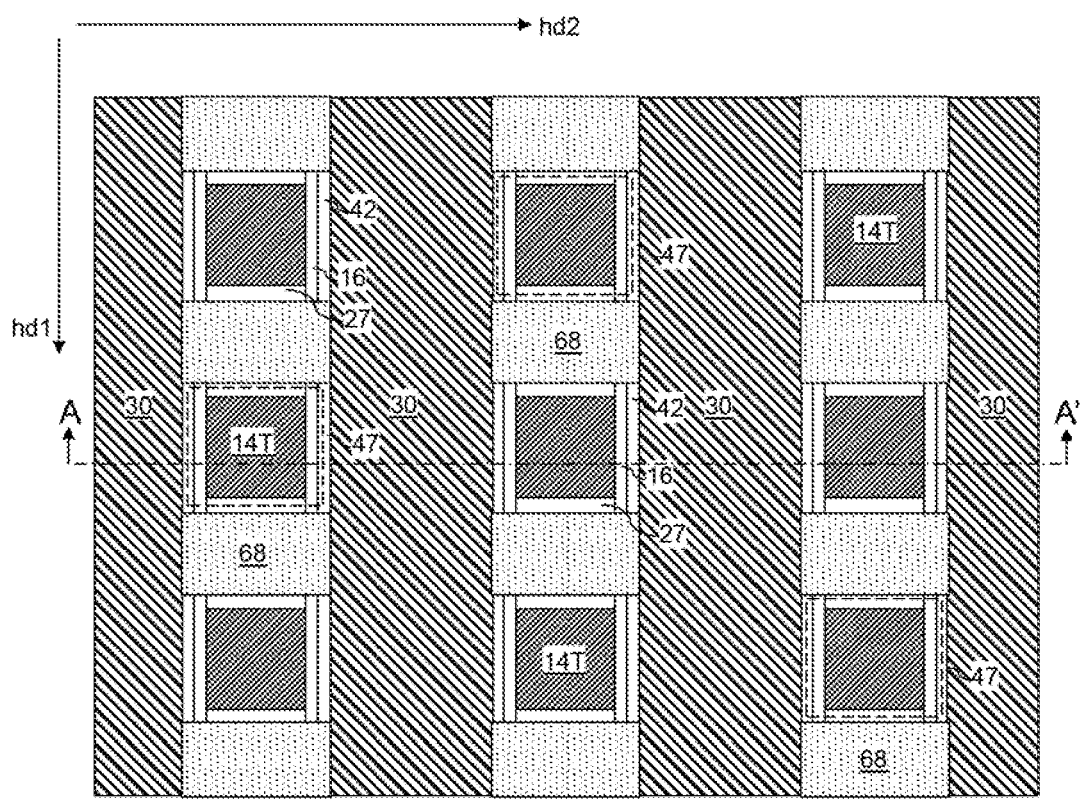
FIG. 18B is a horizontal cross-sectional view of the array region of the exemplary structure of FIG. 18A along the horizontal plane B-B'. The vertical plane A-A' is the plane of the cross-section for FIG. 18A.

Referring to FIGS. 18A and 18B, bit line cavities 47 can be formed by patterning the separator rail structures 68R into separator pillar structures 68. Specifically, a photoresist layer (not shown) can be applied over the insulating cap layer 61 and the separator rail structures 68R, and can be lithographically patterned to form linear portions that overlie areas of the separator dielectric material portions 12. Line trenches extending along the second horizontal direction hd2 and overlying areas of the global bit lines 10 are formed between remaining portions of the photoresist layer.

An anisotropic etch that removes the dielectric material of the separator rail structures 68R selective to the dielectric material of the insulating cap layer 61 can be performed to remove portions of the separator rail structures 68R that are not covered by a combination of the photoresist layer portions and insulating cap layer 61. Bit line cavities 47 having rectangular horizontal cross-sectional areas and extending through the alternating stacks (30, 60) to top surfaces of the top active regions 14T can be formed, thereby separating the separator rail structures 68R into separator pillar structures 68. The bit line cavities 47 can form a two-dimensional rectangular array. The separator pillar structures 68 can form another two-dimensional rectangular array having the same periodicity as the two-dimensional rectangular array of the bit line cavities 47.

While an embodiment in which the area of each bit line cavity 47 is greater than the area of an underlying top active region 14T, embodiments are expressly contemplated herein in which the area of each bit line cavity 47 is substantially the same as, or is less than, the area of an underlying top active region 14T. Further, the geometrical center of each bit line cavity 47 may be located on a vertical line passing through the geometrical center of an underlying vertical stack of a bottom active region 14B, a semiconductor channel 14C, and a top active region 14T, or may be laterally offset from the vertical line due to an overlay variation during the patterning processes employed to form pattern the alternating stacks (30, 60) and the separator pillar structures 68.

Figure 19A:
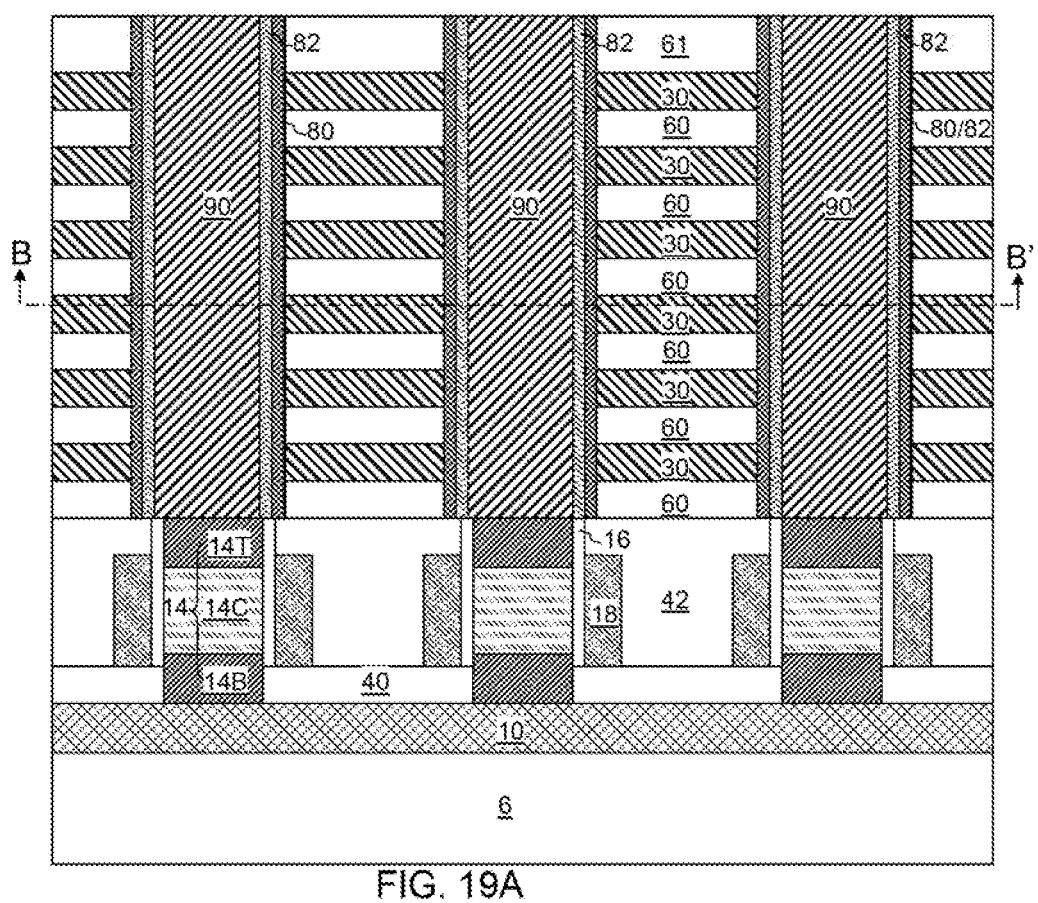
FIG. 19A is a vertical cross-sectional view of the array region of the first exemplary structure after formation of resistive memory layers and bit line structures according to an embodiment of the present disclosure.
Figure 19B:
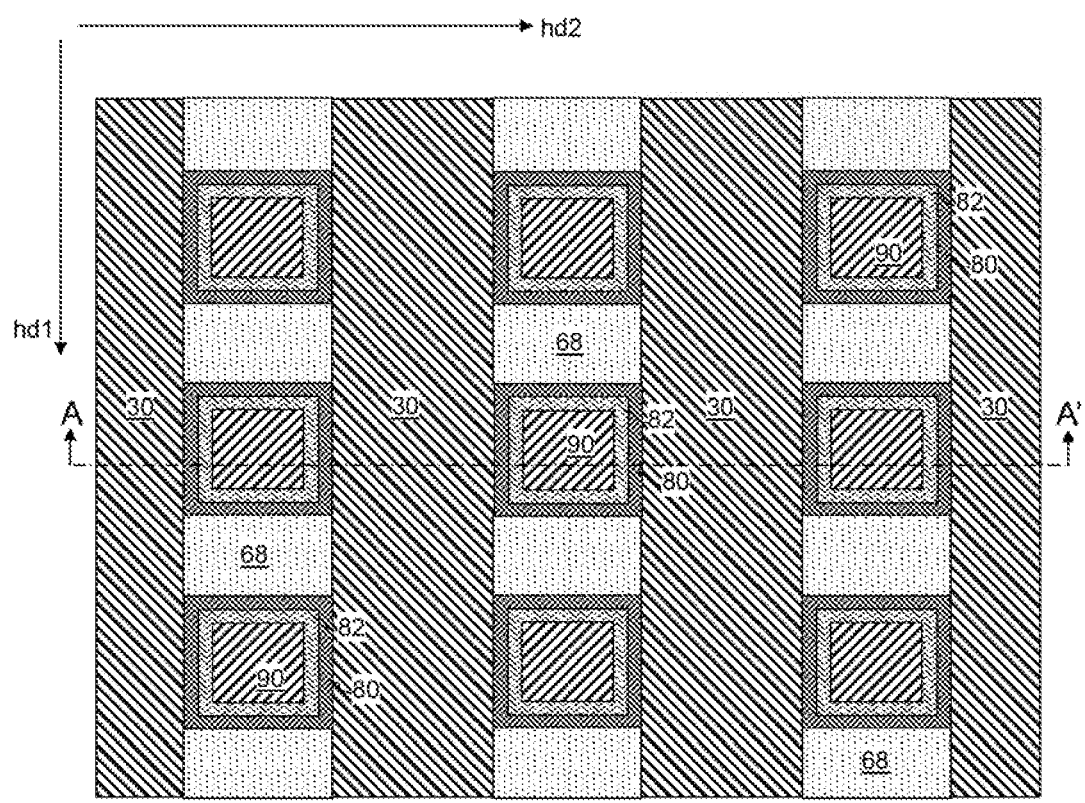
FIG. 19B is a horizontal cross-sectional view of the array region of the exemplary structure of FIG. 19A along the horizontal plane B-B'. The vertical plane A-A' is the plane of the cross-section for FIG. 19A.

Referring to FIGS. 19A and 19B, a resistive memory material layer 80 and an optional steering element layer 82 can be formed on each sidewall of the bit line cavities 47. For example, a continuous resistive memory material layer and a continuous steering element layer can be deposited as continuous layers, and can be anisotropically etched to remove horizontal portions thereof. Each remaining vertical portion of the continuous resistive memory material layer constitutes a resistive memory material layer 80, and each remaining vertical portion of the continuous steering element layer constitutes a steering element layer 82. Each resistive memory material layer 80 can be topologically homeomorphic to a torus, and each steering element layer 82 can be topologically homeomorphic to a torus. As used herein, an element is "topologically homeomorphic to a torus" if the element has a geometrical shape that can be continuously stretched to match a torus without creating or destroying a new hole.

Each resistive memory material layer 80 includes a layer or a layer stack that can provide regions of resistive memory elements. Each resistive memory element includes a resistive memory material. As used herein, a "resistive memory material" or a "reversibly resistance-switching material" is a material of which the resistivity can be altered by application of an electrical bias voltage across the material. As used herein, a "resistive memory material layer" refers to a layer including a resistive memory material. As used herein, a "resistive memory element" refers to an element that includes a portion of a resistive memory material in a configuration that enables programming of the resistive memory material into at least two states having different values of electrical resistance, such as metal oxide (e.g., titanium oxide or nickel oxide) or chalcogenide element. The resistive memory material layer 80 may optionally include a charge carrier barrier layer or tunneling dielectric. As used herein, a "tunneling dielectric" refers to a dielectric material portion in which the predominant mode of electrical current conduction therethrough is charge carrier tunneling such as electron tunneling or hole tunneling. As used herein, a tunneling dielectric layer refers to a layer including at least one tunneling dielectric. For example, the resistive memory element may include a so-called barrier modulated cell ("BMC") memory element including barrier material (e.g., silicon, germanium, another semiconductor material, etc.) and a charge-modulated resistive memory material (e.g., a metal oxide, such as titanium oxide containing vacancies) for so-called storage class memory ("SCM"). As used herein, a "charge-modulated resistive memory material" refers to a resistive memory material that can have at least two different states of resistivity due to different states of charge distribution, which can be due to ion or vacancy modulation. Thus, the charge-modulated resistive memory materials of the present disclosure include vacancy modulated resistive memory materials that can change the distribution (e.g., location or concentration as function of location) of vacancies therein and ionic resistive memory materials that can change the distribution (e.g., location or concentration as function of location) of ions therein.

As used herein, a "steering element" refers to an element, such as a diode, that provides a non-linear current-voltage characteristic for electrical current passing therethrough. In one embodiment, the steering element may have an asymmetric current-voltage characteristic (e.g., a diode which conducts current primarily in one direction (asymmetric conductance) and which has a lower resistance to the flow of current in one direction, and a higher resistance in the other direction). As used herein, a "steering element layer" refers to a layer including at least one steering element.

The materials that can be employed for the resistive memory material layers 80 depend on the nature of the resist memory elements therein. Specific configurations of the resistive memory elements of the present disclosure are described in separate sections below.

A charge carrier barrier layer, if employed, may comprise a semiconductor material layer, such as an amorphous silicon or polysilicon layer. A tunneling dielectric layer, if employed as a sub-element within a resistive memory material layer 80, can include a dielectric material through which electron tunneling or hole tunneling can occur. In one embodiment, the tunneling dielectric layer includes a dielectric material having a dielectric constant of at least 7.0. For example, the tunneling dielectric layer can include a dielectric material selected from silicon nitride and aluminum oxide. In one embodiment, the thickness of the tunneling dielectric layer can be in a range from 0.6 nm to 4 nm (such as from 1.0 nm to 3 nm), although lesser and greater thicknesses can also be employed.

The steering element layer 82 is optional. Thus, depending on the configuration of specific resistive random access memory, the steering element layer 82 may, or may not, be present. Generally speaking, steering elements known in the art can be optionally employed in conjunction with the resistive memory material layers 80 of the present disclosure.

The steering element layers 82, if employed, can include at least one semiconductor element that provides a non-linear current-voltage characteristic. For example, the steering element layer can include at least one diode therein. In one embodiment, each diode can include a heavily doped n-doped semiconductor region (i.e., n+ region) having n-type dopants at an atomic concentration greater than $5.0 \times 10^{19}/cm^3$, and a lightly or lighter doped p-doped semiconductor region (i.e., p− or p region) including p-type dopants at an atomic concentration less than $5.0 \times 10^{19}/cm^3$. Alternatively, a heavily doped p-doped semiconductor region may be used instead. In one embodiment, the n-doped semiconductor regions can be embodied as discrete n-doped semiconductor material portions. In another embodiment, the n-doped semiconductor regions can be embodied as portions of a continuous n-doped semiconductor material layer. In one embodiment, each n-doped semiconductor region can be incorporated as a portion of a local bit line or electrode. In an alternative embodiment, a p-i-n diode, a Schottky diode or a metal-insulator-metal (MIM) non-linear device is used instead of a p-n diode.

Each stack of a resistive memory material layer 80 and a steering element layer 82 constitutes a memory structure (80, 82) that includes a plurality of vertically stacked memory elements. Each portion of the memory structure (80, 82) located at the levels of the electrically conductive layers 30 constitutes a memory element in which information can be stored in the form of a high resistive state or a low resistive state of the respective portion of the memory structure (80, 82). The total number of memory elements within each memory structure (80, 82) can be the same as the total number of electrically conductive layers 30.

While the present disclosure is described employing an embodiment in which the materials of the resistive memory material layers 80 are deposited first, and the materials of the steering element layers 82 are subsequently deposited, embodiments are expressly contemplated herein in which the order of deposition of the materials is reversed. In this case, outer sidewalls of the steering element layers 82 can contact sidewalls of the alternating stacks (30, 60) and sidewalls of the separator pillar structures 68, and inner sidewalls of the steering element layers 82 can contact outer sidewalls of the resistive memory material layers 80.

At least one conductive material is deposited in each remaining volume of the bit line cavities 47 to form vertical bit lines 90 (e.g., local bit lines). The at least one conductive material can include an elemental metal (e.g., tungsten, titanium, etc.), an intermetallic alloy, a conductive doped semiconductor material, and/or a conductive compound including at least one metal and at least one non-metal element such as a conductive metal nitride (e.g., TiN). Excess portions of the at least one conductive material can be removed from above the top surface of the insulating cap layer 61, for example, by a planarization process (such as chemical mechanical planarization and/or a recess etch).

The electrically conductive layers 30 and the global bit lines 10, and optionally, the vertical bit lines 90 can be suitably electrically wired for operation as a resistive random access memory device. The vertical bit lines 90 electrically contact the top region 14T of the access transistor.

Figure 20A:
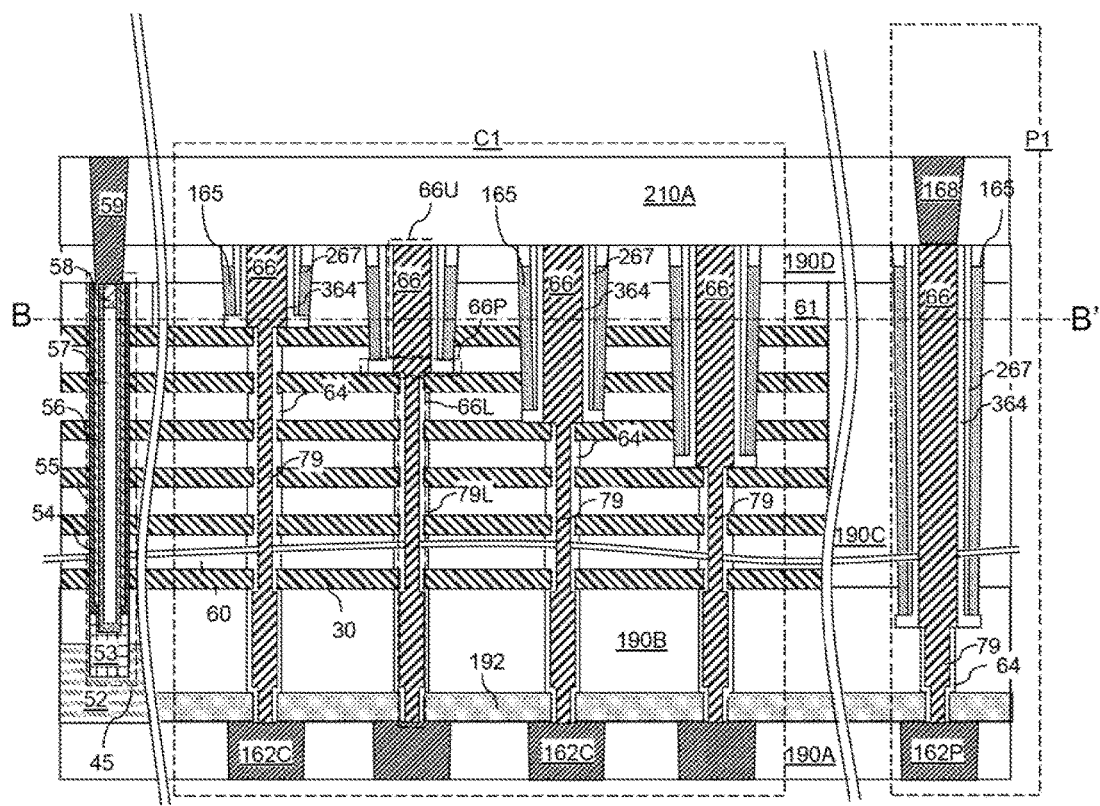
FIG. 20A is a vertical cross-sectional view of an array region, a contact region, and a peripheral device region of a second exemplary structure according to a second embodiment of the present disclosure.
Figure 20B:
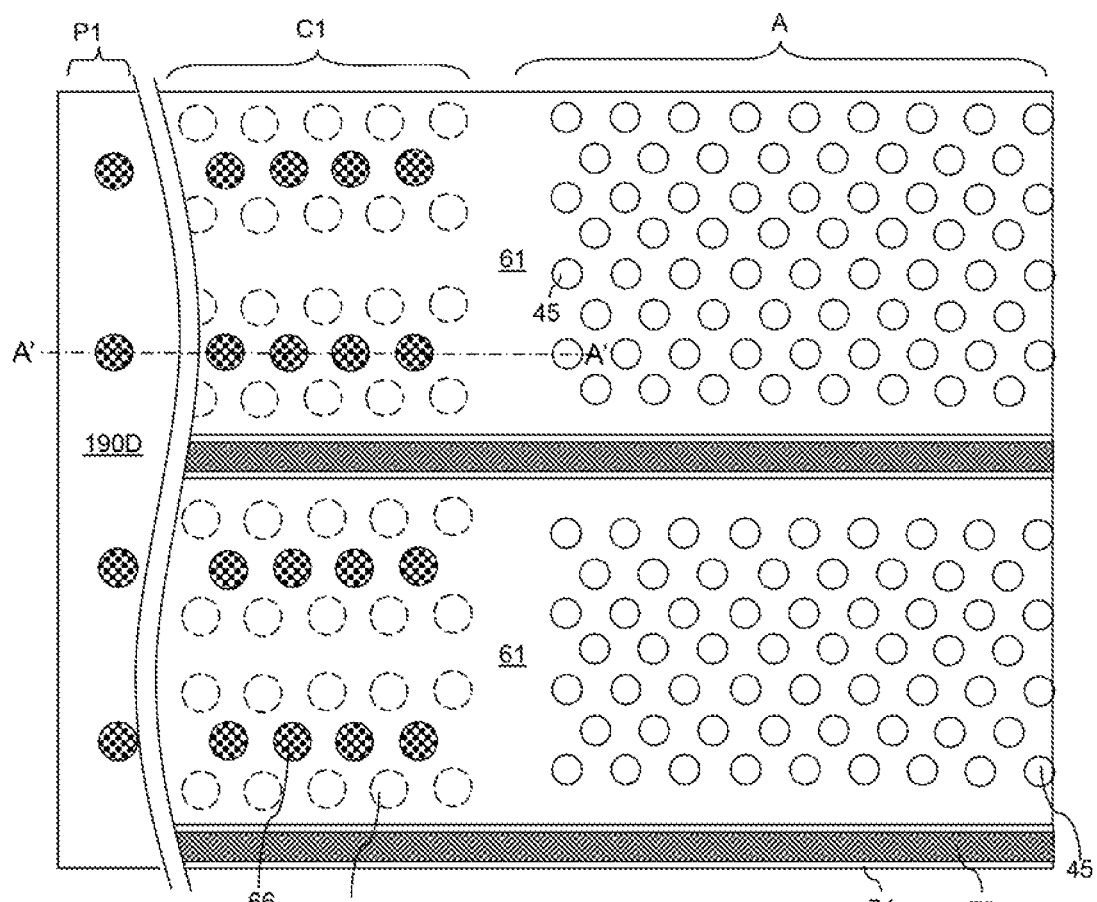
FIG. 20B is a horizontal cross-sectional view of the second exemplary structure of FIG. 20A along the horizontal plane B-B'. The vertical cross-sectional plane A-A' corresponds to the plane of the vertical cross-sectional view of FIG. 20A.

Referring to FIGS. 20A and 20B, a second exemplary structure according to a second embodiment of the present disclosure is illustrated, which can be derived from the first exemplary structure by forming a NAND string as a memory structure instead of a vertical stack of resistive memory elements. A two-dimensional array of NAND strings can be formed within the array region A. Memory stack structures (54, 55, 56) extending through the alternating stack (30, 60) is formed. Each of the memory stack structures (54, 55, 56) comprises a vertical semiconductor channel (55, 56) and charge storage regions formed adjacent to the vertical semiconductor channel (55, 56) at levels of the electrically conductive layers 30 within the alternating stack (30, 60). In this case, the three-dimensional memory device can comprise a monolithic three-dimensional NAND memory device.

For example, each NAND string can be formed on a semiconductor material layer 52, which can be a polysilicon layer having a doping of a first conductivity type and including horizontal semiconductor channels (not explicitly shown) that are upper surface portions of the semiconductor material layer 52. Memory openings can be formed through the alternating stack (30, 60). A pillar channel portion 53 can be formed at the bottom of each memory opening by selective deposition of a semiconductor material. A memory film 54 can be formed on the sidewall of each memory opening and on the top surface of each pillar channel portion 53. The memory film 54 can include, from outside to inside, a blocking dielectric layer, a charge storage region or regions (e.g., a charge trapping material layer), and a tunneling dielectric layer. A first semiconductor channel 55 can be formed on the inner sidewall of each memory film 54. The first semiconductor channel 55 can be anisotropically etched to form an opening at the bottom thereof. A second semiconductor channel 56 can be deposited directly on the pillar channel portion 53 and directly on the inner sidewall of the first semiconductor channel 55. A dielectric core 57 can be formed within any cavity that may remain inside the second semiconductor channel 56. A drain region 58 can be formed at an upper end of the first and second semiconductor channels (55, 56). A set of a pillar channel portion 53, a memory film 54, a first semiconductor channel 55, a second semiconductor channel 56, a dielectric core 57 (if present), and drain region 58 collectively constitute a memory structure 45.

Each drain region 58 of the memory structures 45 can be contacted by a drain contact via structure 59. Electrically inactive dummy structures 145 having the same structural components as the memory structures 45 can be formed in the contact region C, which includes the illustrated contact region C1 shown in FIG. 20B. The electrically inactive dummy structures 145 are not contacted by any contact via structures. In some embodiments, backside trenches can be formed. In this case, each backside trench may be filled with an insulating spacer 74 and a backside contact via structure 76. The first dielectric spacers 165 of the second embodiment can be anisotropically etched as shown in FIG. 10B to have the shape shown in FIG. 15B rather than having the shape shown in FIGS. 15A and 20A.

Each of the exemplary structures of the present disclosure can includes a three-dimensional memory device. The three-dimensional memory device includes: an alternating stack of insulating layers 60 and electrically conductive layers 30 located over a substrate 110; an array of memory structures {(80, 82) or 54} vertically extending through the alternating stack (30, 60), wherein each of the memory structures {(80, 82) or 54} includes memory elements (80 or portions of 54) located at levels of the electrically conductive layers 30, conductive structures 162C located between the substrate 110 and the alternating stack (30, 60), and conductive via structures 66. Each conductive via structure 66 comprises an upper portion 66U that that overlies and contacts a top surface of a respective one of the electrically conductive layers 30 and a lower portion 66L that underlies and is adjoined to the upper portion 66U. The lower portion 66L contacts a top surface of a respective one of the conductive structures 162C and is electrically insulated from a respective subset of the electrically conductive layers 30 that is located between the respective one of the electrically conductive layers 30 and the conductive structures 162C. The device further comprises inner, outer and intermediate dielectric spacers (165, 364, 267) which laterally surround a respective one of the conductive via structures 66.

Each of the inner or outer dielectric spacers (165 or 364) can include a vertical portion that laterally surrounds a respective one of upper portions of the conductive via structures 66 and an annular base portion contacting a top surface of a respective one of the electrically conductive layers 30 and having a greater lateral extent than the vertical portion.

In one embodiment, each of the dielectric spacers (165 or 364) that has the annular base portion comprises the inner dielectric spacers 364 as shown in FIG. 15A. In this embodiment, the three-dimensional memory device also includes first (e.g., outer) dielectric spacers 165 overlying a respective one of the third dielectric spacers 364 (which are inner dielectric spacers) and laterally surrounding a respective one of the upper portions 66U of the conductive via structures 66. In one embodiment, an outer bottom periphery of each first dielectric spacer 165 coincides within an upper periphery of an underlying one of the base annular portions of the inner dielectric spacers (i.e., the third dielectric spacers 364). The second (e.g., intermediate) dielectric spacers 267 contact an inner sidewall of a respective one of the first dielectric spacers 165 and an outer sidewall of the respective one of the third dielectric spacers 364. The third dielectric spacers 364 contact an inner sidewall of a respective one of the second dielectric spacers 267. In one embodiment, the insulating layers 30 comprise a first silicon oxide material, the second dielectric spacers 267 comprise a second silicon oxide material, and an etch rate of the second silicon oxide material in dilute hydrofluoric acid including 1 weight percent of hydrofluoric acid in distilled water is at least twice an etch rate of the first silicon oxide material in the dilute hydrofluoric acid. Each of the third dielectric spacers 364 contacts a sidewall of a respective one of the upper portions 66U of the conductive via structures 66. Each of the first 165 and second 267 dielectric spacers contacts a top surface of respective one of the annular base portions of the third dielectric spacers 364 in the embodiment of FIG. 15A.

In another embodiment, each of the dielectric spacers (165 or 364) that has the annular base portion comprises the first (e.g., outer) dielectric spacers 165, as shown in FIG. 15B. The inner dielectric spacers 364 contact a peripheral portion of a respective one of the annular base portions of the outer dielectric spacers 165 and laterally surround the respective one of the upper portions 66U of the conductive via structures 66. The second (e.g., intermediate) dielectric spacers 267 contact an inner sidewall of a respective one of the outer dielectric spacers 165 and an outer sidewall of the respective one of the inner dielectric spacers 365. Each of the intermediate dielectric spacers 267 contacts a top surface of respective one of the annular base portions of the outer dielectric spacers 165, as shown in FIG. 15B. Each of the inner dielectric spacers 364 contacts a sidewall of a respective one of the upper portions 66U of the conductive via structures 66 as in the prior embodiment.

In one embodiment, the three-dimensional memory device can include lower dielectric spacers 64 comprising a same material as the third dielectric spacers 364 (i.e., inner dielectric spacers). Each of the lower dielectric spacers 64 laterally surrounds a respective one of the lower portions 66L of the contact via structures 66 and contacts a bottom surface of a respective one of the upper portions 66U of the contact via structures 66. In one embodiment, top surfaces of the conductive via structures 66, the first dielectric spacers 165, the second dielectric spacers 267, and the third dielectric spacers 364 can be located within a same horizontal plane.

In one embodiment, each contact area between the upper portion 66U of the conductive via structures 66 and the electrically conductive layers 30 can have an annular shape. In one embodiment, each of the conductive via structures 66 can include: a metallic liner 166 comprising a conductive metal nitride or a conductive metal carbide and extending through an upper portion 66U and a lower portion 66L of a respective one of the conductive via structures 66, and a conductive fill material portion 266 comprising an elemental metal or an intermetallic alloy, embedded within the metallic liner, and extending through the upper portion 66U and the lower portion 66L of the respective one of the conductive via structures 66.

In one embodiment, each of the annular base portions of the inner dielectric spacers 364 has a same vertical thickness that is less than a minimum thickness of the insulating layers 60. The electrically conductive layers 30 can be in a configuration that provides a contact region in which each electrically conductive layer 30 that is not a bottommost electrically conductive layer 30 has a lesser area than any underlying electrically conductive layer 30 among the electrically conductive layers 30 (such as a stepped configuration). In one embodiment, each conductive via structure 66 can physically contact the top surface of the respective one of the electrically conductive layers 30 within a respective area in which none of the electrically conductive layers 30 overlies the respective one of the electrically conductive layers 30 (and is occupied by a respective upper dielectric spacer (165, 267, 364).

In one embodiment, the conductive via structures 66 comprise word line contact via structures, the electrically conductive layers 66 comprise word lines of the three dimensional memory device, and the conductive via structures 66 electrically connect each word line to a respective peripheral device of a driver circuit located below the alternating stack (30, 60) and on the substrate 110.

In some embodiments, as illustrated in the first exemplary structure, the three-dimensional memory device comprises a vertical bit line containing resistive random access memory device. The resistive memory elements can be located adjacent to each of the vertical bit lines and at each level of the electrically conductive layers within the alternating stack. In one embodiment, the device may include barrier modulated cells (portions of the memory structures (80, 82) that are located at levels of the electrically conductive layers 30) as memory elements, and each of the barrier modulated cells comprises a semiconductor material portion and a dielectric metal oxide portion including oxygen vacancies.

In some embodiments, as illustrated in the second exemplary structure, the three-dimensional memory device comprises a monolithic three-dimensional NAND memory device including memory stack structures (54, 55, 56). Each of the memory stack structures (54, 55, 56) comprises a vertical semiconductor channel (55, 56) and charge storage regions (portions of the memory film 54) located adjacent to the vertical semiconductor channel (54, 55) at levels of the electrically conductive layers 30 within the alternating stack (30, 60).

In some embodiments, the three-dimensional memory device comprises a monolithic three-dimensional NAND memory device; the electrically conductive layers 30 comprise, or are electrically connected to, a respective word line of the monolithic three-dimensional NAND memory device; the substrate 110 comprises a silicon substrate; the monolithic three-dimensional NAND memory device comprises an array of monolithic three-dimensional NAND strings over the silicon substrate; at least one memory cell in a first device level of the array of monolithic three-dimensional NAND strings is located over another memory cell in a second device level of the array of monolithic three-dimensional NAND strings (to provide a vertically stacked configuration); the silicon substrate contains an integrated circuit comprising a driver circuit for the memory device located thereon; the electrically conductive layers 30 comprise a plurality of control gate electrodes having a strip shape extending substantially parallel to the top surface of the substrate, the plurality of control gate electrodes comprise at least a first control gate electrode located in the first device level and a second control gate electrode located in the second device level. The array of monolithic three-dimensional NAND strings can comprise: a plurality of semiconductor channels (55, 56), wherein at least one end portion of each of the plurality of semiconductor channels (55, 56) extends substantially perpendicular to a top surface of the substrate 110, and a plurality of charge storage elements, each charge storage element located adjacent to a respective one of the plurality of semiconductor channels (55, 56).

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device comprising:
an alternating stack of insulating layers and electrically conductive layers located over a substrate;
an array of memory structures vertically extending through the alternating stack, wherein each of the memory structures includes memory elements located at levels of the electrically conductive layers;
conductive structures located between the substrate and the alternating stack;
conductive via structures, wherein each conductive via structure comprises:
an upper portion that overlies and contacts a top surface of a respective one of the electrically conductive layers; and
a lower portion that underlies and is adjoined to the upper portion, contacts a top surface of a respective one of the conductive structures, and is electrically insulated from a respective subset of the electrically conductive layers that is located between the respective one of the electrically conductive layers and the conductive structures; and
inner, outer and intermediate dielectric spacers which laterally surround a respective one of the conductive via structures;
wherein:
each conductive via structure physically contacts the top surface of the respective one of the electrically conductive layers within a respective area in which none of the electrically conductive layers overlies the respective one of the electrically conductive layers; and
each of the conductive via structures comprises:
a metallic liner comprising a conductive metal nitride and extending through an upper portion and a lower portion of a respective one of the conductive via structures; and
a conductive fill material portion comprising an elemental metal or an intermetallic alloy, embedded within the metallic liner, and extending through the upper portion and the lower portion of the respective one of the conductive via structures.

2. The three-dimensional memory device of claim 1, wherein:
each of the outer dielectric spacers includes a vertical portion that laterally surrounds a respective one of upper portions of the conductive via structures and an annular base portion contacting a top surface of a respective one of the electrically conductive layers and having a greater lateral extent than the vertical portion; and
each of the inner dielectric spacers contacts a peripheral portion of a respective one of the annular base portions of the outer dielectric spacers and laterally surrounds the respective one of the upper portions of the conductive via structures.

3. The three-dimensional memory device of claim 2, wherein:

the intermediate dielectric spacers contact an inner sidewall of a respective one of the outer dielectric spacers and an outer sidewall of the respective one of the inner dielectric spacers;

the insulating layers comprise a first silicon oxide material;

the intermediate dielectric spacers comprise a second silicon oxide material;

an etch rate of the second silicon oxide material in dilute hydrofluoric acid including 1 weight percent of hydrofluoric acid in distilled water is at least twice an etch rate of the first silicon oxide material in the dilute hydrofluoric acid;

each of the intermediate dielectric spacers contacts a top surface of respective one of the annular base portions of the outer dielectric spacers; and each of the inner dielectric spacers contacts a sidewall of a respective one of the upper portions of the conductive via structures.

4. The three-dimensional memory device of claim 2, further comprising lower dielectric spacers comprising a same material as the inner dielectric spacers, wherein each of the lower dielectric spacers laterally surrounds a respective one of the lower portions of the contact via structures and contacts a bottom surface of the respective one of the upper portions of the conductive via structures.

5. The three-dimensional memory device of claim 1, wherein:

each of the inner dielectric spacers includes a vertical portion that laterally surrounds a respective one of upper portions of the conductive via structures and an annular base portion contacting a top surface of a respective one of the electrically conductive layers and having a greater lateral extent than the vertical portion; and each of the outer dielectric spacers overlies a peripheral portion of a respective one of the annular base portions of the inner dielectric spacers and laterally surrounds the respective one of the upper portions of the conductive via structures.

6. The three-dimensional memory device of claim 5, wherein an outer bottom periphery of each outer dielectric spacer coincides within an upper periphery of an underlying one of the annular base portions of the inner dielectric spacers.

7. The three-dimensional memory device of claim 5, wherein:

the intermediate dielectric spacers contact an inner sidewall of a respective one of the outer dielectric spacers;

the insulating layers comprise a first silicon oxide material;

the intermediate dielectric spacers comprise a second silicon oxide material; and an etch rate of the second silicon oxide material in dilute hydrofluoric acid including 1 weight percent of hydrofluoric acid in distilled water is at least twice an etch rate of the first silicon oxide material in the dilute hydrofluoric acid.

8. The three-dimensional memory device of claim 7, wherein:

the inner dielectric spacers contact an inner sidewall of a respective one of the intermediate dielectric spacers;

each of the outer and intermediate dielectric spacers contacts a top surface of respective one of the annular base portions of the inner dielectric spacers; and each of the inner dielectric spacers contacts a sidewall of a respective one of the upper portions of the conductive via structures.

9. The three-dimensional memory device of claim 7, further comprising lower dielectric spacers comprising a same material as the inner dielectric spacers, wherein each of the lower dielectric spacers laterally surrounds a respective one of the lower portions of the contact via structures and contacts a bottom surface of the respective one of the upper portions of the conductive via structures.

10. The three-dimensional memory device of claim 7, wherein top surfaces of the conductive via structures, the outer dielectric spacers, the intermediate dielectric spacers, and the inner dielectric spacers are located within a same horizontal plane.

11. The three-dimensional memory device of claim 1, wherein the three-dimensional memory device comprises a resistive random access memory device including vertical bit lines and resistive memory elements located adjacent to each of the vertical bit lines and at each level of the electrically conductive layers within the alternating stack.

12. The three-dimensional memory device of claim 1, wherein the three-dimensional memory device comprises a monolithic three-dimensional NAND memory device including memory stack structures, wherein each of the memory stack structures comprises a vertical semiconductor channel and charge storage regions located adjacent to the vertical semiconductor channel at levels of the electrically conductive layers within the alternating stack.

13. The three-dimensional memory device of claim 1, wherein:

the conductive via structures comprise word line contact via structures;

the electrically conductive layers comprise word lines of the three dimensional memory device; and the conductive via structures electrically connect each word line to a respective peripheral device of a driver circuit located below the alternating stack.

* * * * *